(12) United States Patent
Akram

(10) Patent No.: US 7,646,075 B2
(45) Date of Patent: Jan. 12, 2010

(54) MICROELECTRONIC IMAGERS HAVING FRONT SIDE CONTACTS

(75) Inventor: Salman Akram, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 558 days.

(21) Appl. No.: 11/177,905

(22) Filed: Jul. 7, 2005

(65) Prior Publication Data

US 2006/0044433 A1   Mar. 2, 2006

Related U.S. Application Data

(60) Provisional application No. 60/605,752, filed on Aug. 31, 2004.

(51) Int. Cl.
*H01L 21/00* (2006.01)
(52) U.S. Cl. .................. 257/434; 257/433; 257/432; 257/E31.054; 257/E23.194; 438/66; 438/67
(58) Field of Classification Search ......... 257/431–435, 257/E31.054, E23.194; 438/64, 66, 67
See application file for complete search history.

(56) References Cited

U.S. PATENT DOCUMENTS

| | | |
|---|---|---|
| 3,345,134 A | 10/1967 | Heymer et al. |
| 4,534,100 A | 8/1985 | Lane |
| 4,906,314 A | 3/1990 | Farnworth et al. |
| 5,130,783 A | 7/1992 | McLellan |
| 5,371,397 A | 12/1994 | Maegawa et al. |
| 5,424,573 A | 6/1995 | Kato et al. |
| 5,435,887 A | 7/1995 | Rothschild et al. |
| 5,505,804 A | 4/1996 | Mizuguchi et al. |
| 5,560,047 A | 10/1996 | Shimada |
| 5,593,913 A | 1/1997 | Aoki |
| 5,605,783 A | 2/1997 | Revelli et al. |
| 5,672,519 A | 9/1997 | Song et al. |

(Continued)

FOREIGN PATENT DOCUMENTS

EP   0 886 323   12/1998

(Continued)

OTHER PUBLICATIONS

U.S. Appl. No. 10/785,466, Kirby.

(Continued)

*Primary Examiner*—Kiesha L. Rose
*Assistant Examiner*—Tucker Wright
(74) *Attorney, Agent, or Firm*—Dickstein Shapiro LLP

(57) ABSTRACT

Microelectronic imager assemblies with front side contacts and methods for fabricating such microelectronic imager assemblies are disclosed herein. In one embodiment, a microelectronic imager assembly comprises a workpiece including a substrate having a front side and a backside. The assembly further includes a plurality of imaging dies on and/or in the substrate. The imaging dies include image sensors at the front side of the substrate, integrated circuitry operatively coupled to the image sensors, and bond-pads at the front side of the substrate electrically coupled to the integrated circuitry. The assembly also includes a plurality of stand-offs at the front side of the substrate. The stand-offs have apertures aligned with corresponding image sensors. The assembly further includes a plurality of external contacts electrically coupled to corresponding bond-pads and projecting away from the dies.

51 Claims, 14 Drawing Sheets

U.S. PATENT DOCUMENTS

| | | | |
|---|---|---|---|
| 5,694,246 | A | 12/1997 | Aoyama et al. |
| 5,708,293 | A | 1/1998 | Ochi et al. |
| 5,771,158 | A | 6/1998 | Yamagishi et al. |
| 5,776,824 | A | 7/1998 | Farnworth et al. |
| 5,811,799 | A | 9/1998 | Wu |
| 5,821,532 | A | 10/1998 | Beaman et al. |
| 5,857,963 | A | 1/1999 | Pelchy et al. |
| 5,861,654 | A | 1/1999 | Johnson |
| 5,877,040 | A | 3/1999 | Park et al. |
| 5,897,338 | A | 4/1999 | Kaldenberg |
| 5,914,488 | A | 6/1999 | Sone |
| 5,977,535 | A | 11/1999 | Rostoker |
| 5,998,862 | A | 12/1999 | Yamanaka |
| 6,080,291 | A | 6/2000 | Woodruff et al. |
| 6,104,086 | A | 8/2000 | Ichikawa et al. |
| 6,114,240 | A | 9/2000 | Akram et al. |
| 6,130,448 | A * | 10/2000 | Bauer et al. ............. 257/222 |
| 6,143,588 | A | 11/2000 | Glenn |
| 6,236,046 | B1 | 5/2001 | Watabe et al. |
| 6,259,083 | B1 | 7/2001 | Kimura |
| 6,266,197 | B1 | 7/2001 | Glenn et al. |
| 6,274,927 | B1 | 8/2001 | Glenn |
| 6,285,064 | B1 | 9/2001 | Foster |
| 6,351,027 | B1 | 2/2002 | Giboney et al. |
| 6,372,548 | B2 | 4/2002 | Bessho et al. |
| 6,407,381 | B1 | 6/2002 | Glenn et al. |
| 6,411,439 | B2 | 6/2002 | Nishikawa |
| 6,483,652 | B2 | 11/2002 | Nakamura |
| 6,503,780 | B1 | 1/2003 | Glenn et al. |
| 6,541,762 | B2 | 4/2003 | Knag et al. |
| 6,566,745 | B1 | 5/2003 | Beyne et al. |
| 6,603,183 | B1 | 8/2003 | Hoffman |
| 6,617,623 | B2 | 9/2003 | Rhodes |
| 6,661,047 | B2 | 12/2003 | Rhodes |
| 6,667,551 | B2 | 12/2003 | Hanaoka et al. |
| 6,670,986 | B1 | 12/2003 | Ben Shoshan et al. |
| 6,686,588 | B1 | 2/2004 | Webster et al. |
| 6,703,310 | B2 | 3/2004 | Mashino et al. |
| 6,864,172 | B2 | 4/2004 | Noma et al. |
| 6,734,419 | B1 | 5/2004 | Glenn et al. |
| 6,759,266 | B1 | 7/2004 | Hoffman |
| 6,774,486 | B2 | 8/2004 | Kinsman |
| 6,778,046 | B2 | 8/2004 | Stafford et al. |
| 6,791,076 | B2 | 9/2004 | Webster |
| 6,795,120 | B2 | 9/2004 | Takagi et al. |
| 6,797,616 | B2 | 9/2004 | Kinsman |
| 6,800,943 | B2 | 10/2004 | Adachi |
| 6,813,154 | B2 | 11/2004 | Diaz et al. |
| 6,825,458 | B1 | 11/2004 | Moess et al. |
| 6,828,663 | B2 | 12/2004 | Chen et al. |
| 6,828,674 | B2 | 12/2004 | Karpman |
| 6,844,978 | B2 | 1/2005 | Harden et al. |
| 6,882,021 | B2 | 4/2005 | Boon et al. |
| 6,885,107 | B2 | 4/2005 | Kinsman |
| 6,934,065 | B2 | 8/2005 | Kinsman |
| 6,946,325 | B2 | 9/2005 | Yean et al. |
| 2002/0006687 | A1 | 1/2002 | Lam |
| 2002/0057468 | A1 | 5/2002 | Segawa et al. |
| 2002/0089025 | A1 | 7/2002 | Chou |
| 2002/0096729 | A1 | 7/2002 | Tu et al. |
| 2002/0113296 | A1 | 8/2002 | Cho et al. |
| 2002/0145676 | A1 | 10/2002 | Kuno et al. |
| 2003/0062601 | A1 | 4/2003 | Harnden et al. |
| 2004/0012698 | A1 | 1/2004 | Suda et al. |
| 2004/0023469 | A1 | 2/2004 | Suda |
| 2004/0038442 | A1 | 2/2004 | Kinsman |
| 2004/0041261 | A1 | 3/2004 | Kinsman |
| 2004/0082094 | A1 | 4/2004 | Yamamoto |
| 2004/0214373 | A1 | 10/2004 | Jiang et al. |
| 2004/0245649 | A1 | 12/2004 | Imaoka |
| 2005/0052751 | A1 | 3/2005 | Liu et al. |
| 2005/0063033 | A1 * | 3/2005 | Kinsman ............. 359/245 |
| 2005/0104228 | A1 | 5/2005 | Rigg et al. |
| 2005/0110889 | A1 | 5/2005 | Tuttle et al. |
| 2005/0127478 | A1 | 6/2005 | Hiatt et al. |
| 2005/0151228 | A1 | 7/2005 | Tanida et al. |
| 2005/0236708 | A1 | 10/2005 | Farnworth et al. |
| 2005/0254133 | A1 | 11/2005 | Akram et al. |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.
Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

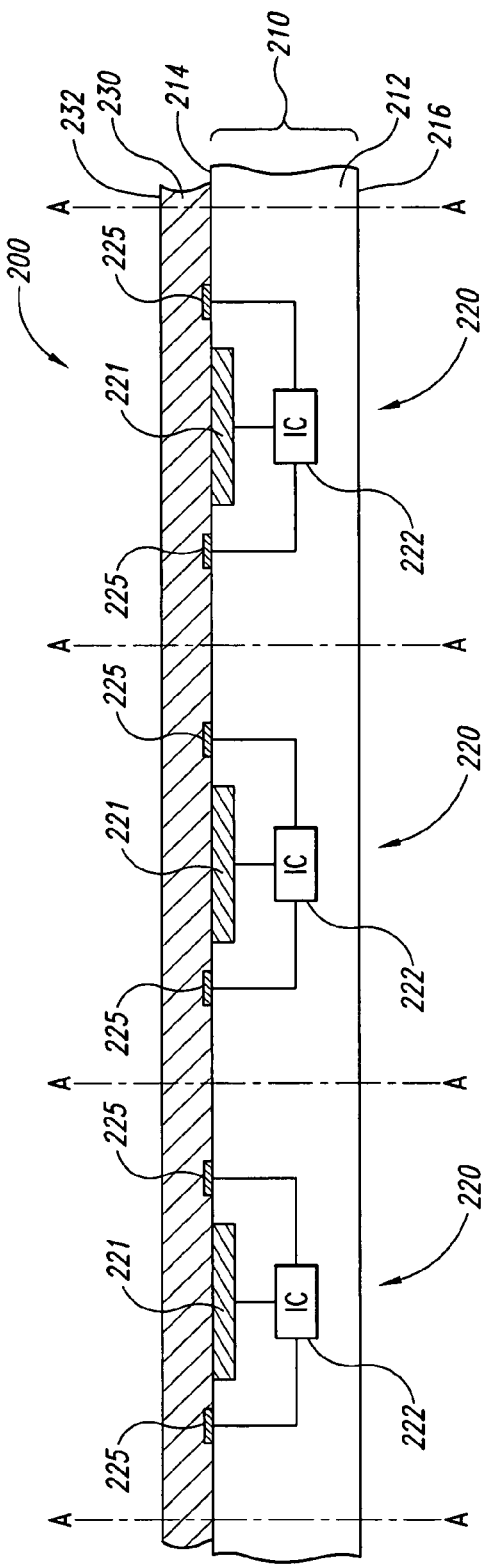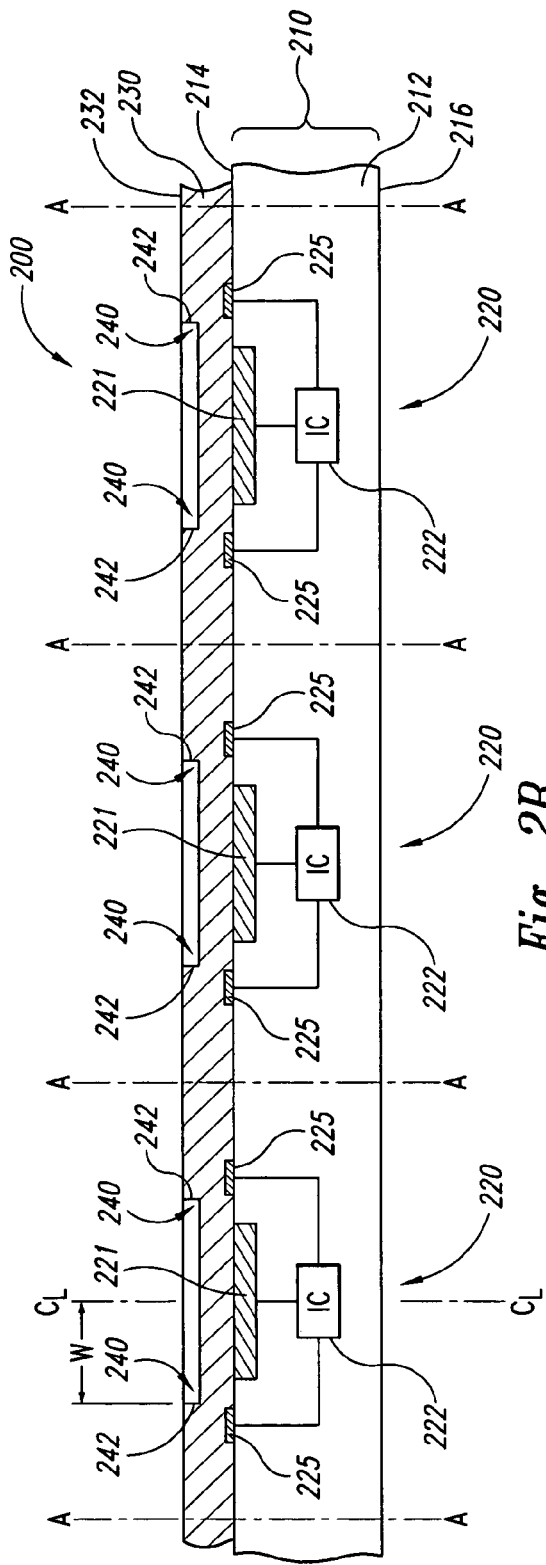

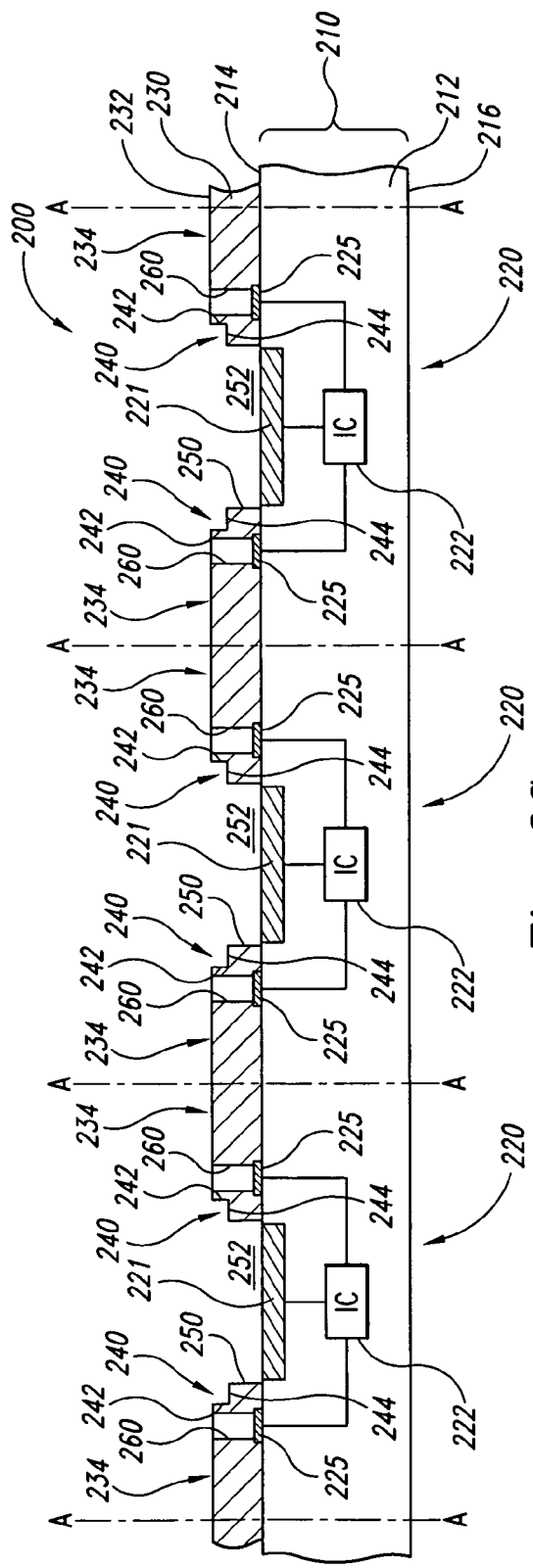
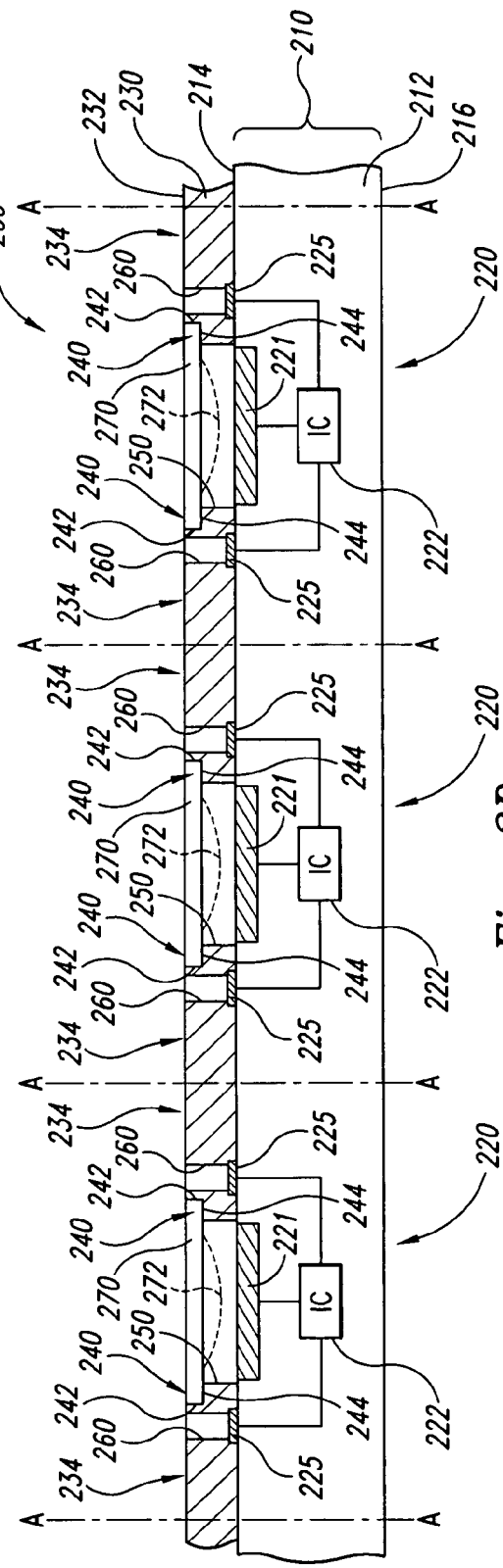

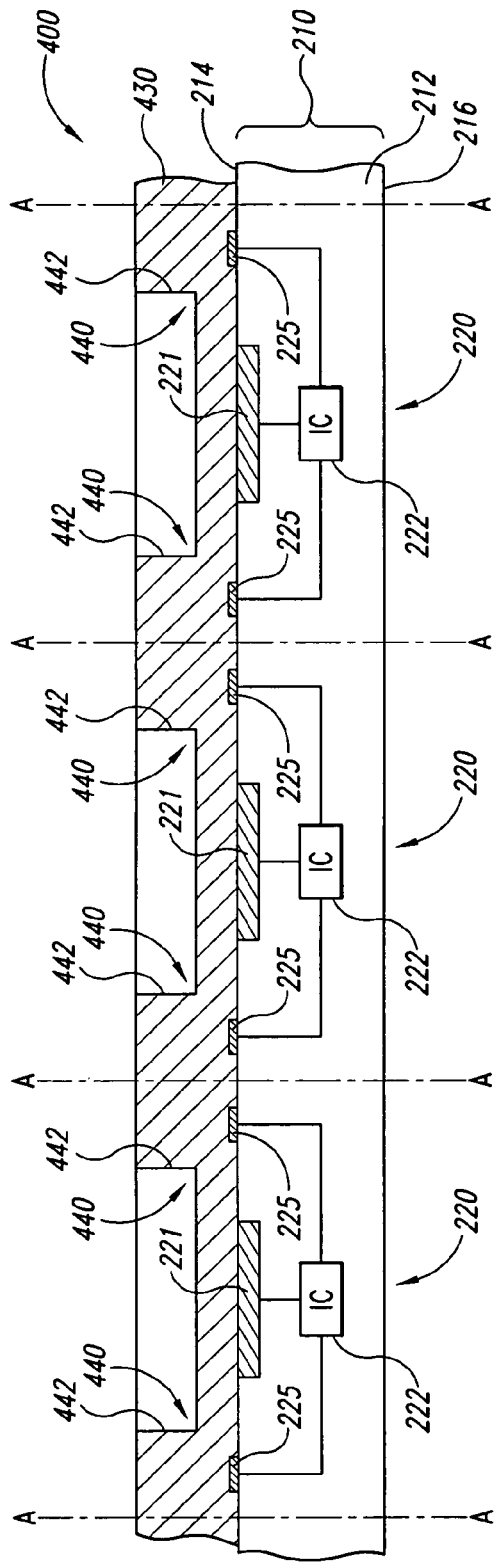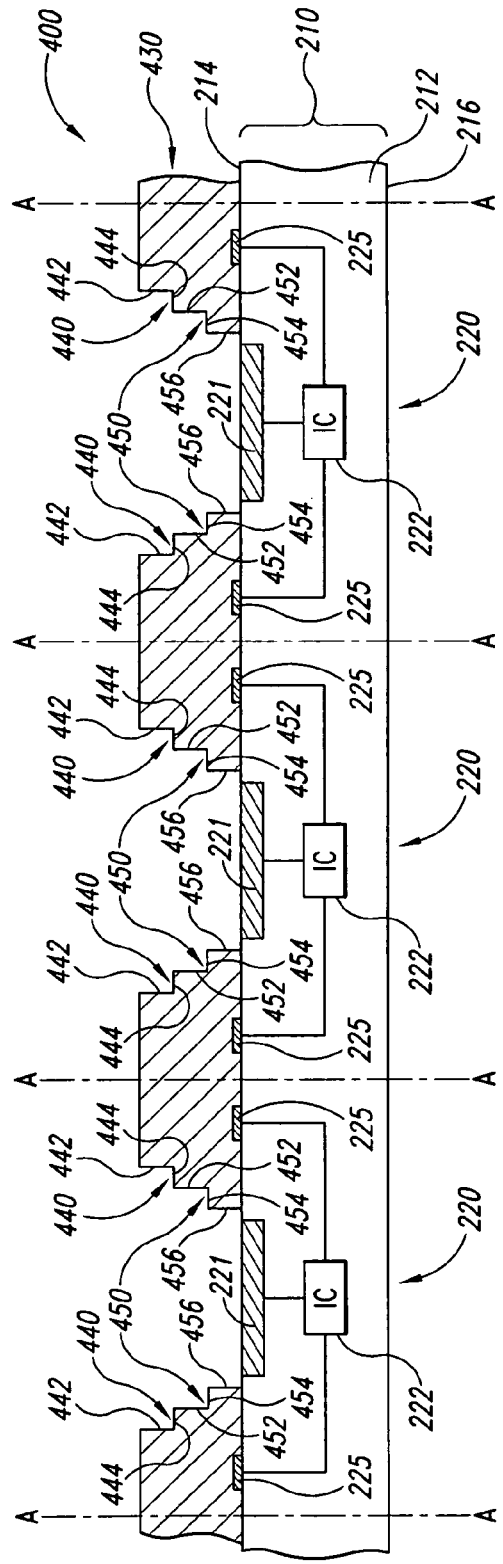
Fig. 4A
Fig. 4B

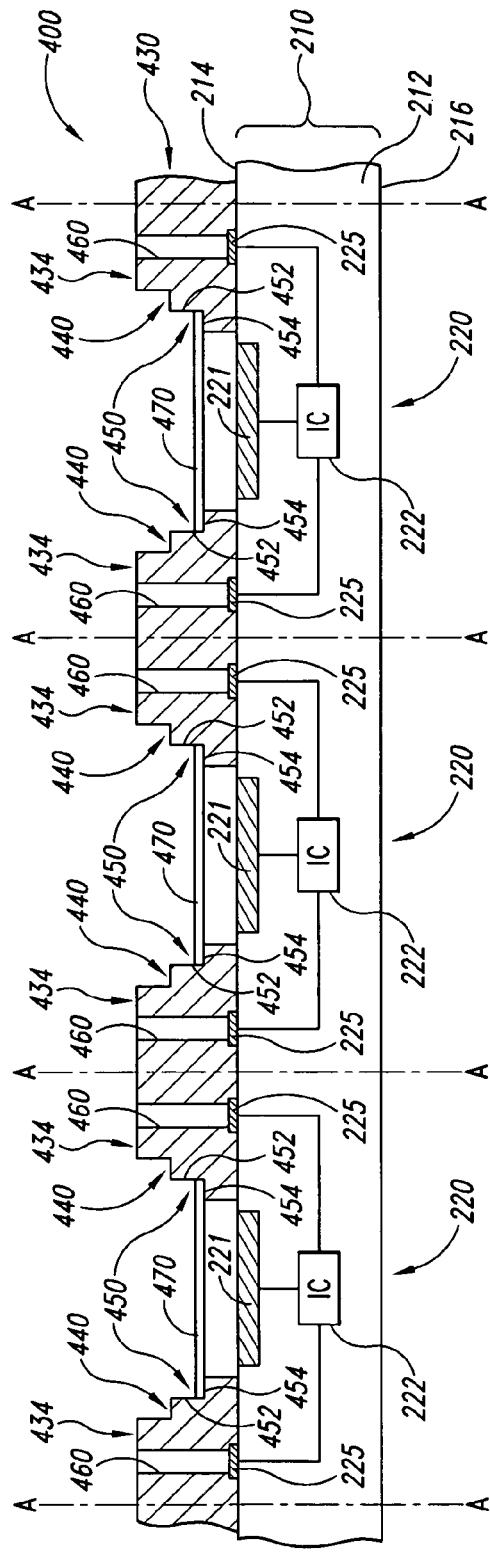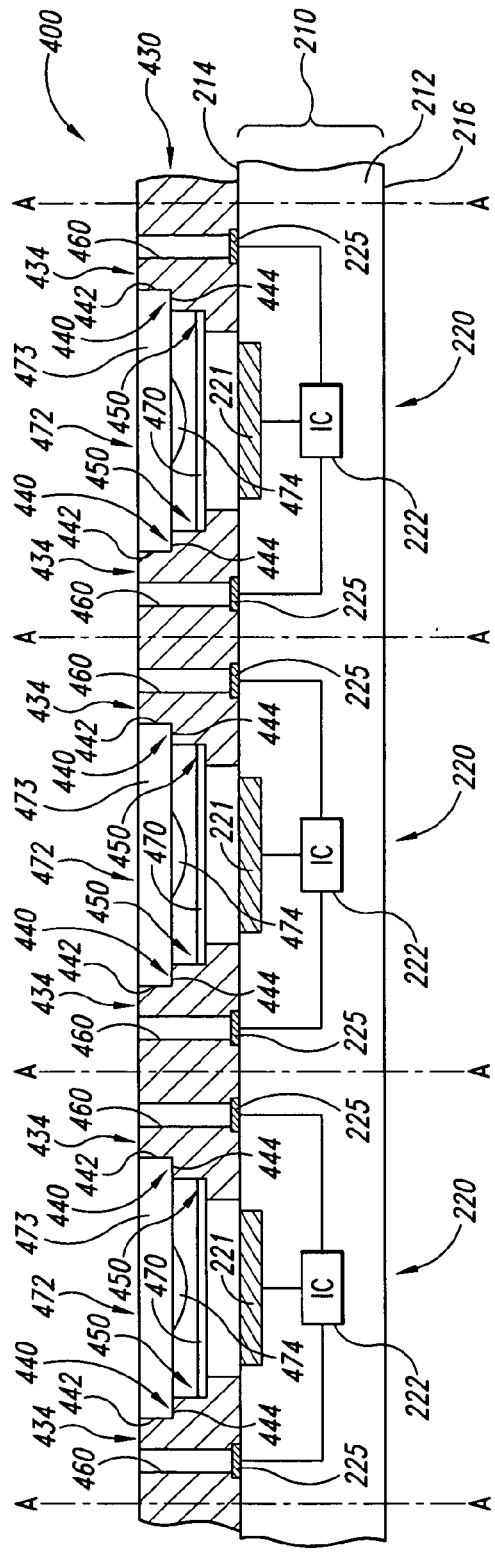

MICROELECTRONIC IMAGERS HAVING FRONT SIDE CONTACTS

CROSS-REFERENCE TO RELATED APPLICATION

This application claims the benefit of U.S. Provisional Patent Application No. 60/605,752 filed Aug. 31, 2004, which is incorporated herein by reference in its entirety.

TECHNICAL FIELD

The present invention is related to microelectronic imagers and methods for packaging microelectronic imagers. Several aspects of the present invention are directed toward microelectronic imagers having front side contacts.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer substrate 20 attached to the die 10, and a spacer 30 attached to the interposer substrate 20. The spacer 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the spacer 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with conventional packaged microelectronic imagers is that they have relatively large footprints and occupy a significant amount of vertical space (i.e., high profiles). For example, the footprint of the imager 1 in FIG. 1 is the surface area of the bottom of the interposer substrate 20, which is significantly larger than the surface area of the die 10. Accordingly, the footprint of conventional packaged microelectronic imagers can be a limiting factor in the design and marketability of picture cell phones or PDAs because these devices are continually shrinking to be more portable. Therefore, there is a need to provide microelectronic imagers with smaller footprints and lower vertical profiles.

Another problem with conventional microelectronic imagers is the manufacturing costs for packaging the dies. For example, forming the wire-bonds 28 on the imager 1 shown in FIG. 1 is complex and expensive because it requires connecting an individual wire between each bond-pad 14 on the die 10 and a corresponding interior pad 22 on the interposer substrate 20. In addition, it may not be feasible to form wire-bonds for the high-density, fine-pitch arrays of some high-performance devices. Therefore, there is a significant need to enhance the efficiency and reliability of packaging microelectronic imagers.

BRIEF DESCRIPTION OF THE DRAWINGS

FIGS. 2A-2E are side cross-sectional views illustrating stages of a method for forming a microelectronic imager assembly with front side contacts in accordance with an embodiment of the invention.

FIGS. 4A-4E are side cross-sectional views illustrating stages of a method for forming a microelectronic imager assembly with front side contacts in accordance with still another embodiment of the invention.

DETAILED DESCRIPTION

A. Overview

The following disclosure describes several embodiments of methods for assembling microelectronic imaging devices with front side contacts, microelectronic imaging devices formed by such methods, and imager assemblies with such imaging devices. One embodiment of a microelectronic imager assembly comprises a workpiece including a substrate having a front side and a backside. The assembly further includes a plurality of imaging dies on and/or in the substrate. The imaging dies include image sensors at the front side of the substrate, integrated circuitry operatively coupled to the image sensors, and bond-pads at the front side of the substrate electrically coupled to the integrated circuitry. The assembly also includes a plurality of stand-offs at the front side of the substrate. The stand-offs have apertures aligned with corresponding image sensors. The assembly further includes a plurality of external contacts electrically coupled to corresponding bond-pads and projecting away from the dies. In several embodiments, the external contacts include interconnects through the stand-offs in contact with corresponding bond-pads on the die. In alternative embodiments, the external contacts include connectors coupled to the bond-pads at the front side of the substrate.

Another aspect of the invention is directed toward a method for fabricating microelectronic imaging devices. The method includes providing an imager workpiece including a substrate having a front side, a backside, and a plurality of imaging dies on and/or in the substrate. The individual imaging dies include an image sensor at the front side, an integrated circuit electrically coupled to the image sensor, and a plurality of bond-pads at the front side of the substrate electrically coupled to the integrated circuit. The method also includes constructing stand-offs on the workpiece before cutting the workpiece. The stand-offs have openings aligned with corresponding image sensors. The method further includes electrically coupling a plurality of external contacts to corresponding bond-pads such that the external contacts project away from the die.

Several details of specific embodiments of the invention are described below with reference to CMOS imagers to provide a thorough understanding of these embodiments. CCD imagers or other types of sensors, however, can be used instead of the CMOS imagers in other embodiments of the invention. Several details describing well-known structures often associated with microelectronic devices may not be set forth in the following description for the purposes of brevity. Moreover, other embodiments of the invention can have different configurations or different components than those described in this section. As such, other embodiments of the invention may have additional elements or may not include all of the elements shown and described below with reference to FIGS. 2A-5C.

B. Microelectronic Imagers with Front Side Contacts

Figure 2E:
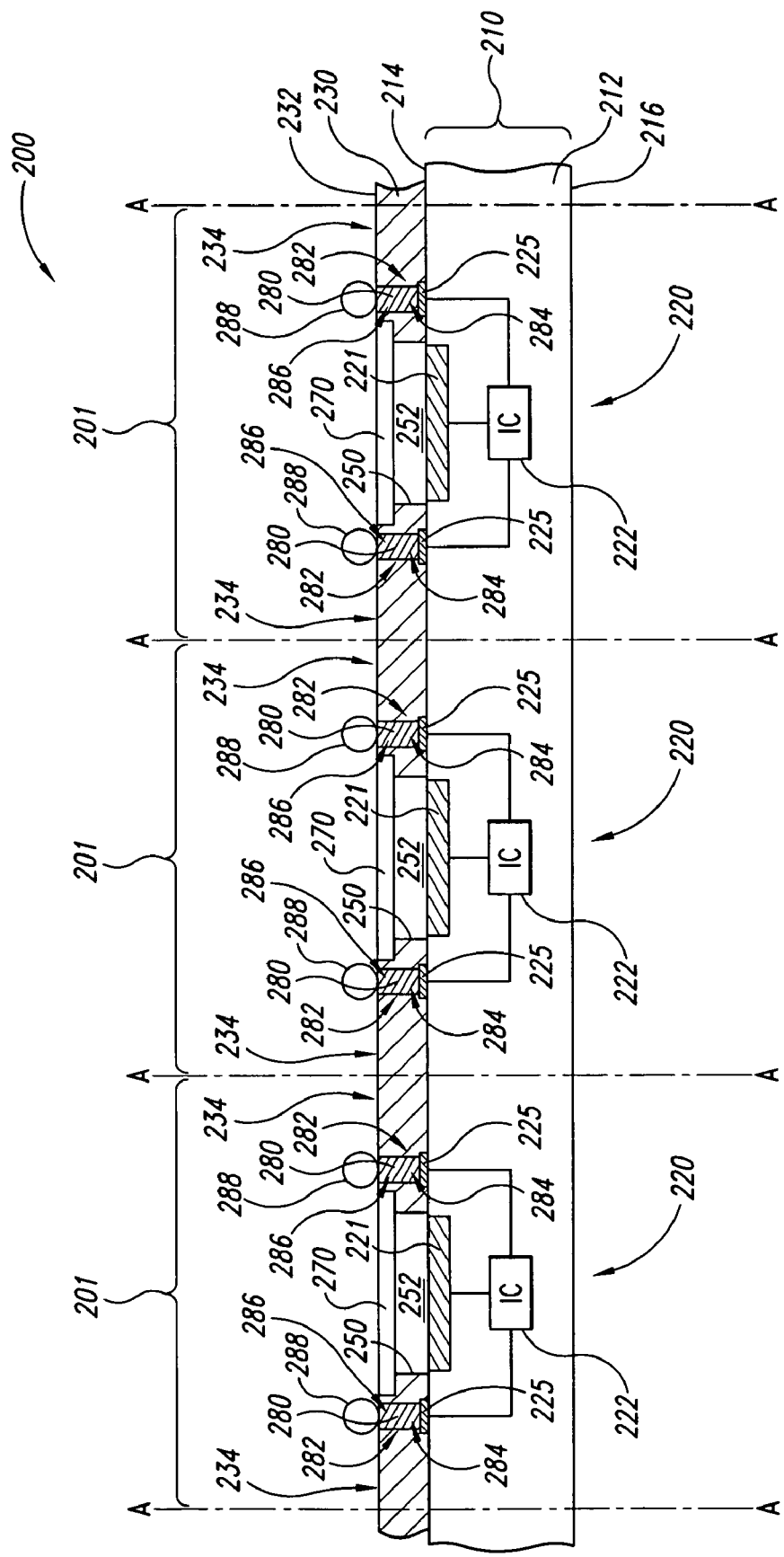

FIGS. 2A-2E illustrate various stages in one embodiment of a method for forming a microelectronic imager assembly with front side contacts. FIG. 2A, for example, is a side cross-sectional view showing a portion of an assembly 200 fabricated in accordance with several embodiments of the invention. The assembly 200 includes an imager workpiece 210 having a substrate 212 with a front side 214 and a backside 216. The imager workpiece 210 further includes a plurality of imaging dies 220 formed on and/or in the substrate 212. Individual imaging dies 220 can include an image sensor 221, integrated circuitry 222 operatively coupled to the image sensor 221, and bond-pads 225 electrically coupled to the integrated circuitry 222. The image sensors 221 can be CMOS or CCD image sensors for capturing pictures or other images in the visible spectrum, but the image sensors 221 can detect radiation in other spectrums (e.g., infrared radiation (IR) or ultraviolet (UV) ranges). In the illustrated embodiment, the bond-pads 225 are at the front side 214 of the substrate 212. In other embodiments, however, the bond-pads 225 may be at an intermediate depth within the substrate 212.

The assembly 200 at the stage of the method shown in FIG. 2A also includes a support material layer 230 from which a plurality of stand-offs on the assembly 200 can be formed. The support material layer 230 is generally deposited onto the front side 214 of the substrate 212 using spin-on techniques, vapor deposition processes (e.g., chemical vapor deposition or physical vapor deposition), spraying techniques, molding, and/or other processes known to those of skill in the art. Alternatively, the support material layer 230 can be deposited onto the substrate 212 using three-dimensional stereolithography apparatuses and processes commercially available from 3D Systems, Inc. of Valencia, Calif. The support material layer 230 has an upper surface 232 at a desired distance from the front side 214 of the substrate 212 to define a reference plane relative to the image sensors 221. The upper surface 232, for example, can be formed at a precise distance from the front side 214 of the substrate 212 by planarizing the support material layer 230 using chemical-mechanical planarization. In several embodiments, however, the three-dimensional stereolithography process can produce the upper surface 232 at the desired distance from the front side 214 of the substrate 212 without planarizing the support material layer 230. The support material layer 230 can be composed of a three-dimensional stereolithography material, an epoxy, a UV curable material, and/or another suitable material.

A plurality of interface features 240 are then etched into the upper portion of the support material layer 230. Referring to FIG. 2B, for example, the upper portion of the support material layer 230 is patterned and etched to an intermediate depth using a first etch, such as an anisotropic etch, to form alignment components 242 at a desired lateral location relative to the corresponding image sensors 221. The alignment components 242 provide a fixed surface at a known position for accurately positioning covers at a predetermined location relative to the image sensors 221. For example, the alignment components 242 are laterally spaced apart from the centerline $C_L$-$C_L$ of corresponding image sensors 221 by a precise distance W to engage the edges of covers over corresponding imager sensors 221.

Referring to FIG. 2C, stop components 244 of the interface features 240 and openings 252 are then formed from the remaining portion of the support material layer 230. A second etch forms the stop components 244 at a desired distance relative to the image sensors 221. The stop components 244 provide a fixed surface at a known elevation for accurately positioning covers at a desired position relative to the image sensors 221. The second etch also forms sidewalls 250 superimposed relative to a perimeter zone around corresponding image sensors 221. The sidewalls 250 shape the openings 252 so that they are aligned with corresponding image sensors 221. The openings 252 are generally sized so that they correspond with the size of the image sensors 221, but this is not necessary. In several instances, the openings 252 are larger than the image sensors 221 to allow more light to reach the image sensors 221. The second etch can be an anisotropic etch that is stopped at or slightly before the front side 214 of the substrate 212. In an alternative embodiment, the interface features 240 and the openings 252 may be formed using other processes, such as a different etching process, a laser cutting process, a mechanical machining process, and/or a stereolithography process.

After the stand-offs 234 have been formed as shown in FIG. 2C, a plurality of passages or vias 260 can be formed through the support material layer 230. The passages 260 can extend through the stand-offs 234 and be aligned with corresponding bond-pads 225 on the front side 214 of the substrate 212. In the illustrated embodiment, the passages 260 are etched through the support material layer 230 using a suitable pattern and etch process. In alternative embodiments, the passages 260 can be mechanically machined and/or laser cut through the stand-offs 234.

A plurality of covers 270 are then mounted to corresponding interface features 240, as shown in FIG. 2D. The covers 270 in the illustrated embodiment have been singulated to separate the individual covers 270 from each other before being mounted to the interface features 240. The covers 270 can be glass, quartz, or other materials transmissive to a desired spectrum of radiation. In embodiments directed toward imaging radiation in the visible spectrum, the covers 270 can also filter infrared radiation or other undesirable spectrums of radiation. The covers 270, for example, can be formed from a material and/or can have a coating that filters IR or near IR spectrums. In several embodiments, the covers 270 may include a curved surface 272 (shown in broken lines) for directing the radiation as it passes through the cover 270. The curved surfaces 272 can have any combination of convex and/or concave curvatures with respect to the substrate 212 to provide the desired optics. One feature of the illustrated embodiment is that the covers 270 are attached to the imaging dies 220 on and/or in the workpiece 210 before singulating the workpiece 210. An advantage of this feature is that the image sensors 221 are covered by the corresponding covers 270 when the workpiece 210 is cut to protect the image sensors 221 from debris (e.g., small particles) generated during the singulation process.

Referring to FIG. 2E, the method continues by filling the individual passages 260 (shown in FIG. 2D) with a conductive fill material 280 to form front side interconnects 282. The interconnects 282 are external contacts projecting away from the front side 214 of the substrate 212. The individual interconnects 282 include a first portion 284 electrically coupled to the corresponding bond-pads 225 and a second portion 286 spaced apart from the first portion 284. The interconnects 282 can be conductive plugs in the passages 260 through the stand-offs 234 formed from the fill material 280. The fill material 280 can be solder, conductive epoxy, conductive polymers, and/or other electrically conductive materials. Various processes can be used to deposit the fill material 280 into the passages 260. In one embodiment, the fill material 280 can be deposited into the passages 260 using an electroplating process. In other embodiments, the fill material 280 can be deposited by stenciling, a solder wave process, placing preformed spheres of metal fill in the passages 260 and melting the spheres, or injecting a flowable material into the passages 260. Alternatively, in still further embodiments the fill material 280 can be deposited into the passages 260 using other methods known to those of skill in the art.

In alternative embodiments, the steps in the method described above can be performed in a different order. For example, the passages 260 can be formed and the fill material 280 can be deposited into the passages 260 to form the interconnects 282 before the interface features 240 and openings 252 are formed over the corresponding image sensors 221.

A plurality of conductive connectors 288 (e.g., solder balls) can be attached to the second portions 286 of the interconnects 282 after depositing the fill material 280 into the passages 260. The connectors 288 provide external contacts to electrically couple the interconnects 282 to other devices at the front side 214 of the imaging dies 220. In additional embodiments, the interconnects 282 may have different configurations and/or be formed by other suitable processes. For example, the interconnects 282 may extend at least partially along the upper portion of the stand-offs. Moreover, the interconnects 282 may not include connectors 288 and/or the connectors 288 may have a different configuration.

Figure 2F:
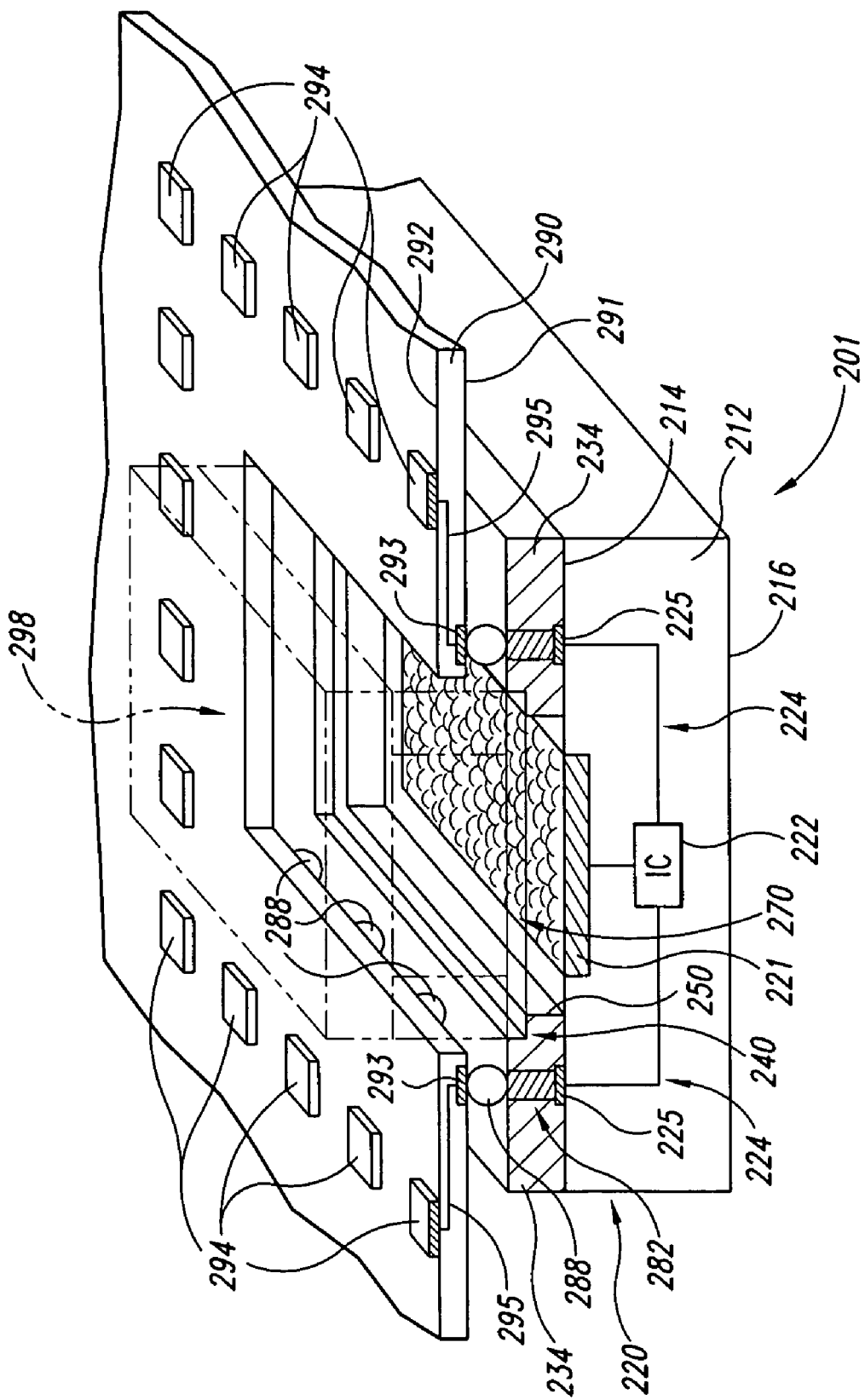
FIG. 2F is a cross-sectional isometric view illustrating a microelectronic imaging unit of FIG. 2E after singulation and attachment to a support member in accordance with an embodiment of the invention.

FIG. 2F is a cross-sectional isometric view of an individual imaging unit 201 after the assembly 200 of FIG. 2E has been cut along lines A-A to singulate the individual imaging units 201. The singulated imaging unit 201 can be mounted to a support member 290, such as flex tape, a circuit board, or another suitable device, to redistribute the array of connectors 288 to a larger pitch to interface with an external device. For example, in the illustrated embodiment the support member 290 includes a first side 291 with a plurality of first contact pads 293, a second side 292 with a plurality of second contact pads 294 (e.g., ball-pads), and an opening 296 aligned with the image sensor 221 A plurality of traces 295 extend through the support member 290 to electrically couple the first contact pads 293 to corresponding second contact pads 294. The connectors 288 on the imaging unit 201 physically attach the imaging unit 201 to the support member 290 and form an electrical connection between the interconnects 282 and corresponding first contact pads 293. Thus, the second contact pads 294 on the support member 290 are electrically coupled to the integrated circuitry 222 of the imaging die 220.

In several embodiments, an optical device 298 (shown in broken lines) can be installed at least partially within the opening 296. Various aspects of the optical device 298 are described in more detail below with reference to FIGS. 4D and 4F-4H. The optical device can be attached to the imaging unit 201 and/or the support member 290. As explained in more detail below, the optical device 298 can be lenses and/or layers of materials that provide the desired optical characteristics for presenting the selected radiation to the image sensor 221. In alternative embodiments, the singulated imaging unit 201 may not be attached to the support member 290, or the imaging unit 201 may be attached to the support member 290 in a different arrangement.

Figure 1:
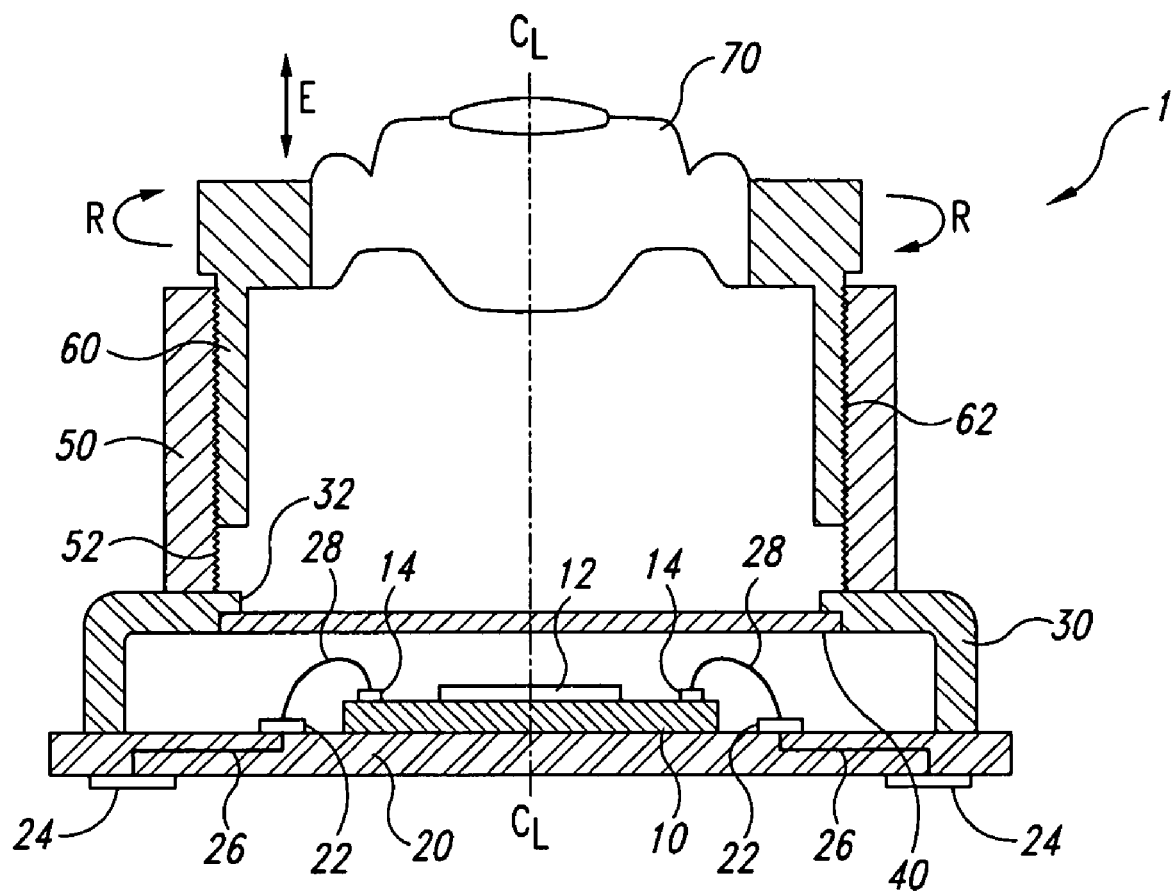
FIG. 1 is a schematic side cross-sectional view of a packaged microelectronic imager in accordance with the prior art.

One feature of the embodiment illustrated in FIG. 2F is that the interconnects 282 electrically couple the bond-pads 225 to the first contact pads 293 on the support member 290 and therefore eliminate the need for wire-bonds. An advantage of this feature is that without wire-bonds, the footprint of the imaging die 220 can be smaller because the interconnects 282 are coupled to the support member 290 directly over the die 220. The reduced footprint allows the illustrated device to be used in smaller electronic devices. In prior art devices, such as the device illustrated in FIG. 1, the bond-pads 14 are wire-bonded to interior pads 22 outboard the die 10, which increases the footprint of the substrate 20.

Another advantage of the embodiment illustrated in FIG. 2F is that placing the optical device 298 (shown in broken lines) in the opening 296 of the support member 290 reduces the vertical profile or height of the device. More specifically, the vertical profile of the imaging device shown in FIG. 2F is the distance between the top of the optical device 298 and the bottom of the die 220. In prior art devices, such as the device illustrated in FIG. 1, the vertical profile of the device is the distance between the top of the optics unit 70 and the bottom of the substrate 20 attached to the back side of the die 10. Thus, the vertical profile of the device illustrated in FIG. 2F is reduced by at least the thickness of the support member 290 because the optical device 298 is placed in the opening 296 of the support member 290 instead of mounting the backside 216 of the die 220 to the support member 290.

Another feature of the method illustrated in FIGS. 2A-2F is that the interconnects 282 are front side contacts projecting away from the front side 214 of the substrate 212. One advantage of front side contacts is that they are expected to be easier to fabricate and/or they are expected to simplify subsequent processing compared to wire-bonding or through-wafer interconnects. For example, the interconnects 282 can be easily formed through the support material layer 230 and electrically coupled to the bond-pads 225 at the front side 214 of the substrate 212 without having to form holes in the wafer and/or dielectric liners in such holes. Forming through-wafer interconnects extending through the dies accordingly requires additional processing steps and materials to accommodate the materials and structures of the wafer. Therefore, the front side interconnects 282 are expected to enhance several aspects of packaging microelectronic imagers.

C. Further Embodiments of Microelectronic Imagers with Front Side Contacts

Figure 3A:
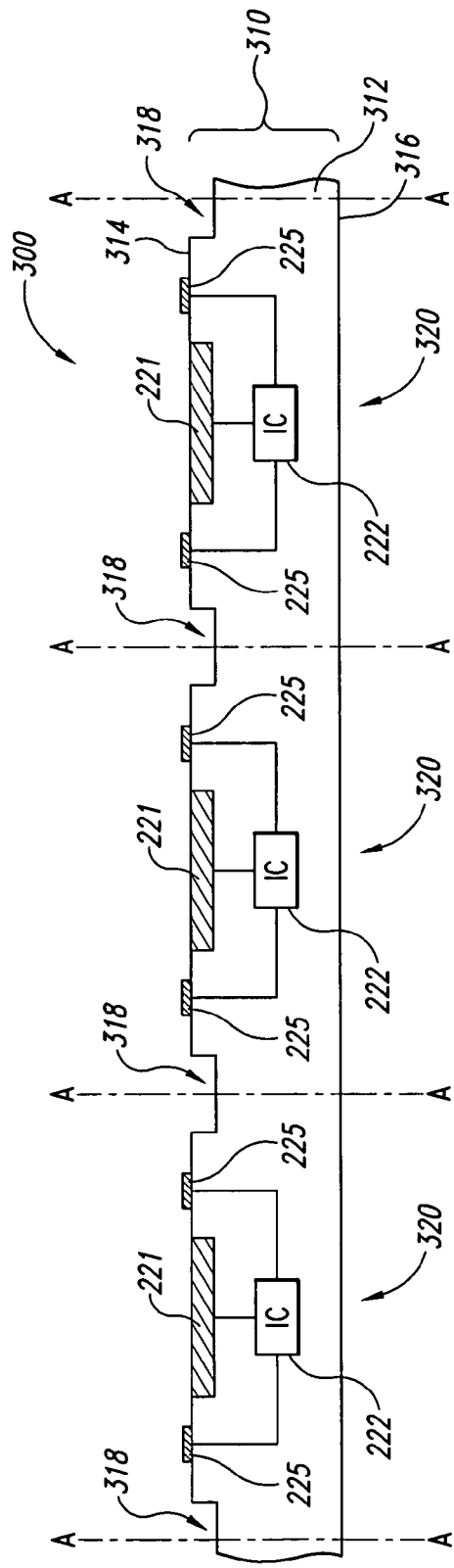
FIGS. 3A-3E are side cross-sectional views illustrating stages of a method for forming a microelectronic imager assembly with front side contacts in accordance with another embodiment of the invention.

FIGS. 3A-3E illustrate various stages of a method for forming a microelectronic imager assembly with front side contacts in accordance with another embodiment of the invention. FIG. 3A, for example, shows an assembly 300 that is similar to the assembly 200 illustrated in FIG. 2A. The methods shown in FIGS. 3A-3E, however, differ from those described above with reference to FIGS. 2A-2E in that the stand-offs formed on the workpiece have a different configuration and the substrate includes a plurality of trenches 318 (e.g., streets) separating the individual imaging dies.

Referring to FIG. 3A, the assembly 300 includes an imager workpiece 310 having a substrate 312 with a front side 314 and a backside 316. The imager workpiece 310 further includes a plurality of imaging dies 320 formed on and/or in the substrate 312. Individual imaging dies 320 can include features generally similar to the imaging dies 220 described above with respect to FIG. 2A.

The front side 314 of the substrate 312 further includes the trenches 318 between the image sensors 221 of individual imaging dies 320. The trenches 318 extend to an intermediate depth within the substrate 312. In the illustrated embodiment, the trenches 318 are etched into the substrate 312 at the front side 314. In other embodiments, however, the trenches 318 may be formed using another suitable process and/or the trenches 318 may extend into the substrate 312 a different depth. As described in detail below, the trenches 318 provide additional protection and structural support for protecting the components of the singulated imaging dies 320.

Figure 3B:
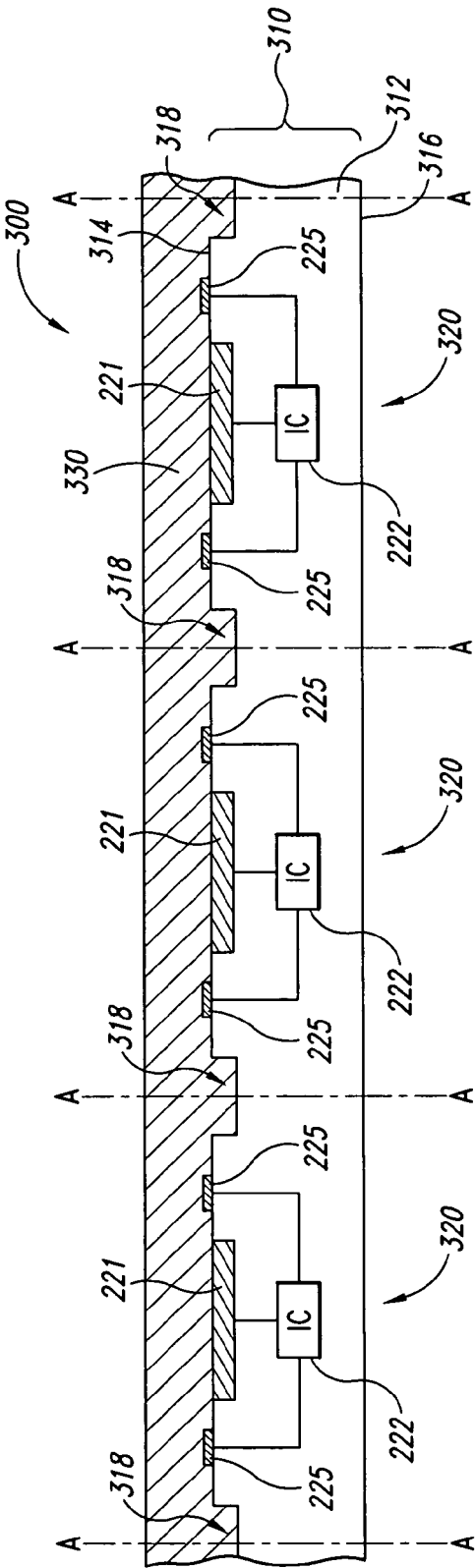

After the trenches 318 have been formed in the substrate 312, a support material layer 330 can be deposited onto the workpiece 310 as shown in FIG. 3B. The support material layer 330 can be deposited onto the front side 314 of the substrate 312 to fill the trenches 318 using the processes described above with respect to FIG. 2A.

Figure 3C:
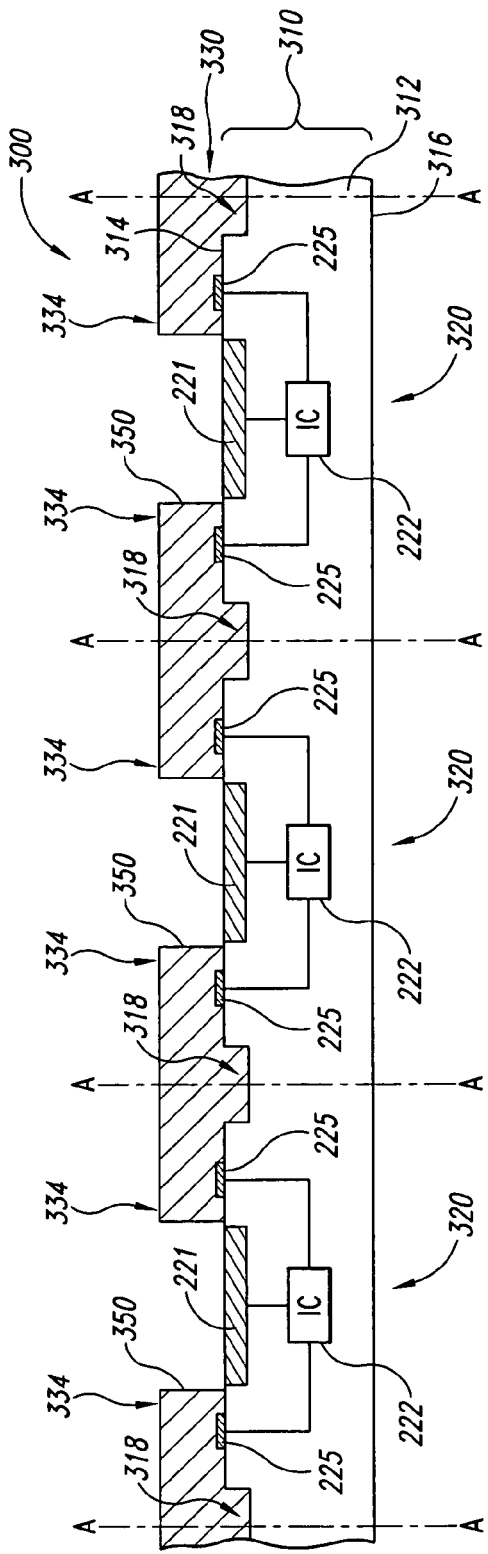

Referring to FIG. 3C, a plurality of stand-offs 234 are then formed by etching sidewalls 350 through the support material layer 330. The sidewalls 350 are generally superimposed relative to a perimeter zone around corresponding image sensors 221 to define openings 352 aligned with corresponding image sensors 221. The stand-offs 334 shown in FIG. 3C differ from the stand-offs 234 described above with respect to FIGS. 2A-2E in that the stand-offs 334 do not include "stepped" interface features. The openings 352 can be formed using an anisotropic etch that stops at or slightly before the front side 314 of the first substrate 212. In an alternative embodiment, the openings 352 may be formed using laser ablation or another suitable process.

Figure 3D:
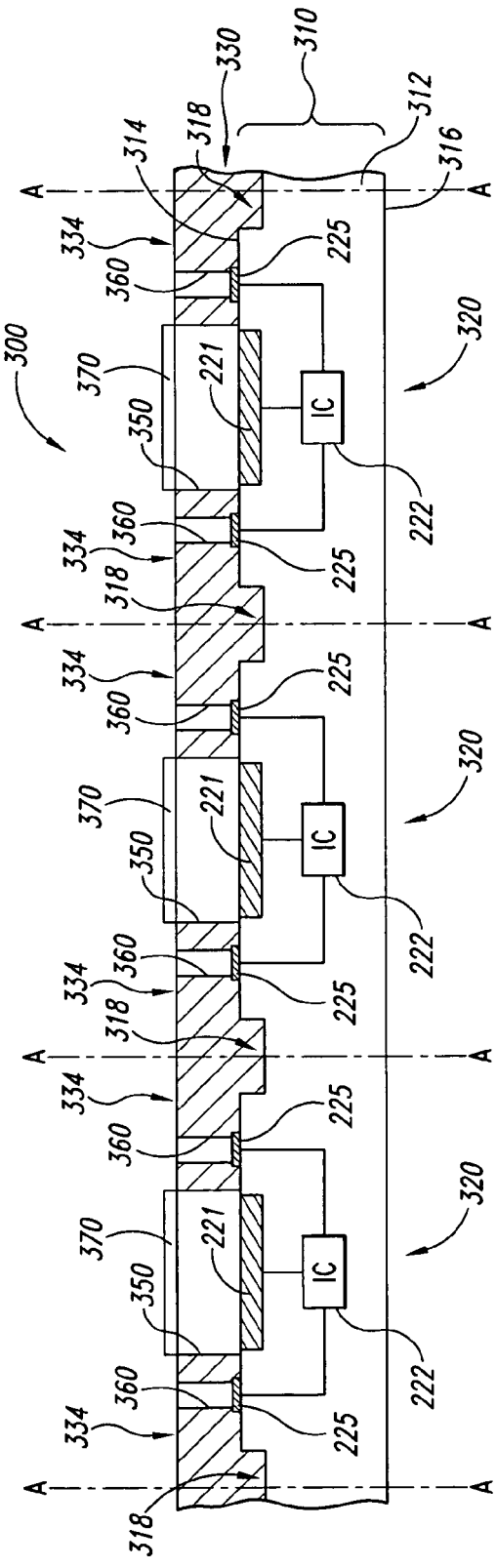

A plurality of passages or vias 360 are then etched, mechanically machined, and/or laser cut into the stand-offs 334. Referring to FIG. 3D, for example, the passages 360 extend through the stand-offs 334 to corresponding bond pads 225 at the front side 314 of the substrate 312. The passages 360 can be generally similar to the passages 260 described above with respect to FIG. 2C.

After the passages 360 have been formed, covers 370 are mounted to the stand-offs 334 over corresponding image sensors 221. The covers 370 have been singulated to separate the individual covers 370 from each other before being mounted to the stand-offs 334. In the illustrated embodiment, the covers 370 are engaged with an upper surface of the stand-offs 334 rather than being seated within a stepped portion of the stand-offs as described above with respect to FIG. 2D. In alternative embodiments, however, the covers 370 can be seated at a different portion of the stand-offs 334. The covers 370 can be generally similar to the covers 270 described above with respect to FIG. 2D.

Figure 3E:
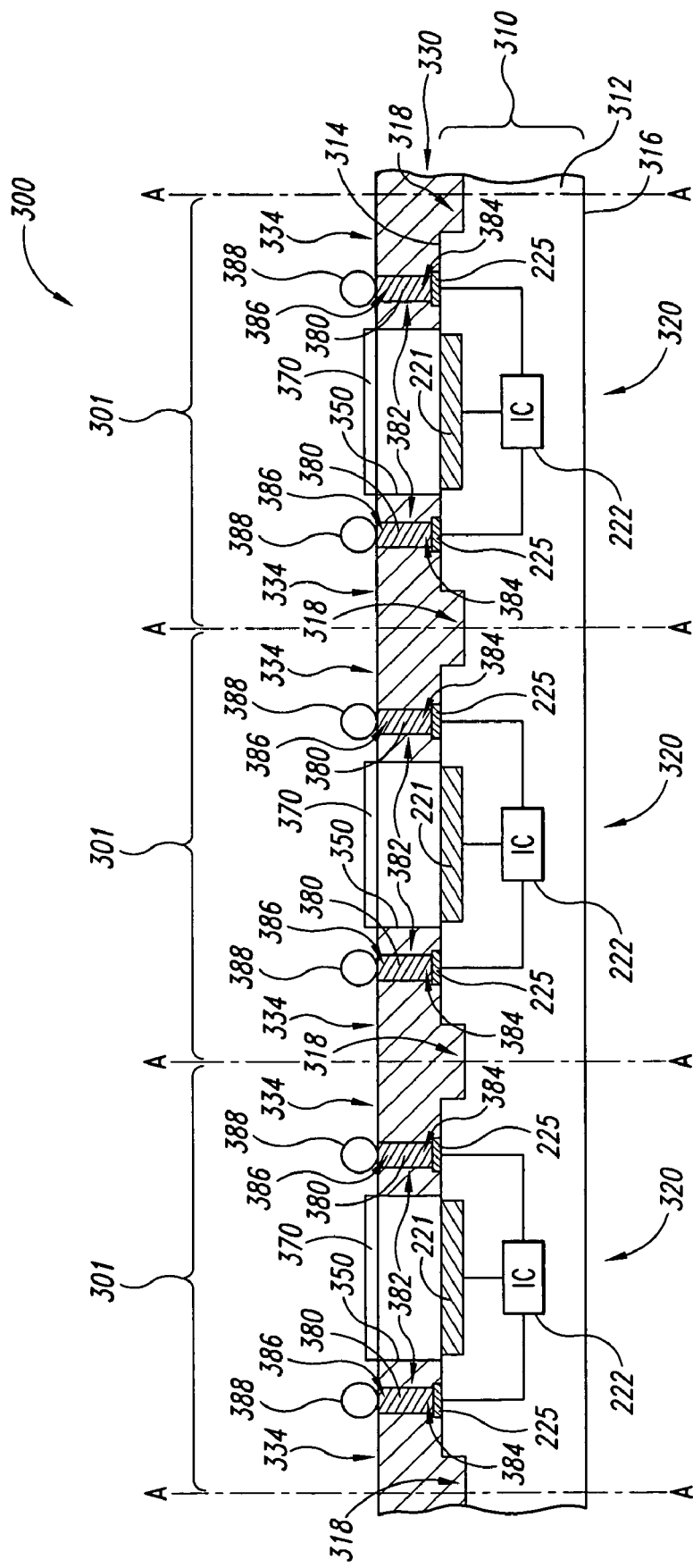

Referring to FIG. 3E, the individual passages 360 (shown in FIG. 3D) are then filled with a conductive fill material 380 to form interconnects 382. The individual interconnects 382 include a first portion 384 electrically coupled to the corresponding bond-pads 225 and a second portion 386 spaced apart from the first portion 384. After forming the interconnects 382, a plurality of conductive connectors 388 can be attached to the second portions 386 of the interconnects 382. The fill material 380, interconnects 382, and connectors 388 can be generally similar to the fill material 280, interconnects 282, and connectors 288 described above with respect to FIG. 2E.

After forming the interconnects 382, the workpiece 310 can be cut along lines A-A to singulate the individual imaging units 301. The individual imaging units 301 can then undergo further processing steps as described above with respect to FIG. 2F or as described below with respect to FIG. 5D.

One feature of the imaging units 301 in the illustrated embodiment is that the trenches 318 at the outside edges of the singulated imaging dies 320 provide more robust packages that have fewer failure points. More specifically, the individual imaging dies 320 typically have six areas (e.g., sides) to seal and protect (i.e., the front sides 314, the four end surfaces defining the perimeter of the dies 320, and the backsides 316). The support layer material 330 deposited into the trenches 318 and the covers 370 over the image sensors 221 inherently provide protection for five of the six sides (i.e., the front side 314 and the four end surfaces). Therefore, only the backsides 316 of the individual dies 320 may need an additional protective layer. This feature provides enhanced protection for the dies 320 and helps prevent contamination or possible damage to the components of the dies 320 during handling.

Figure 4E:
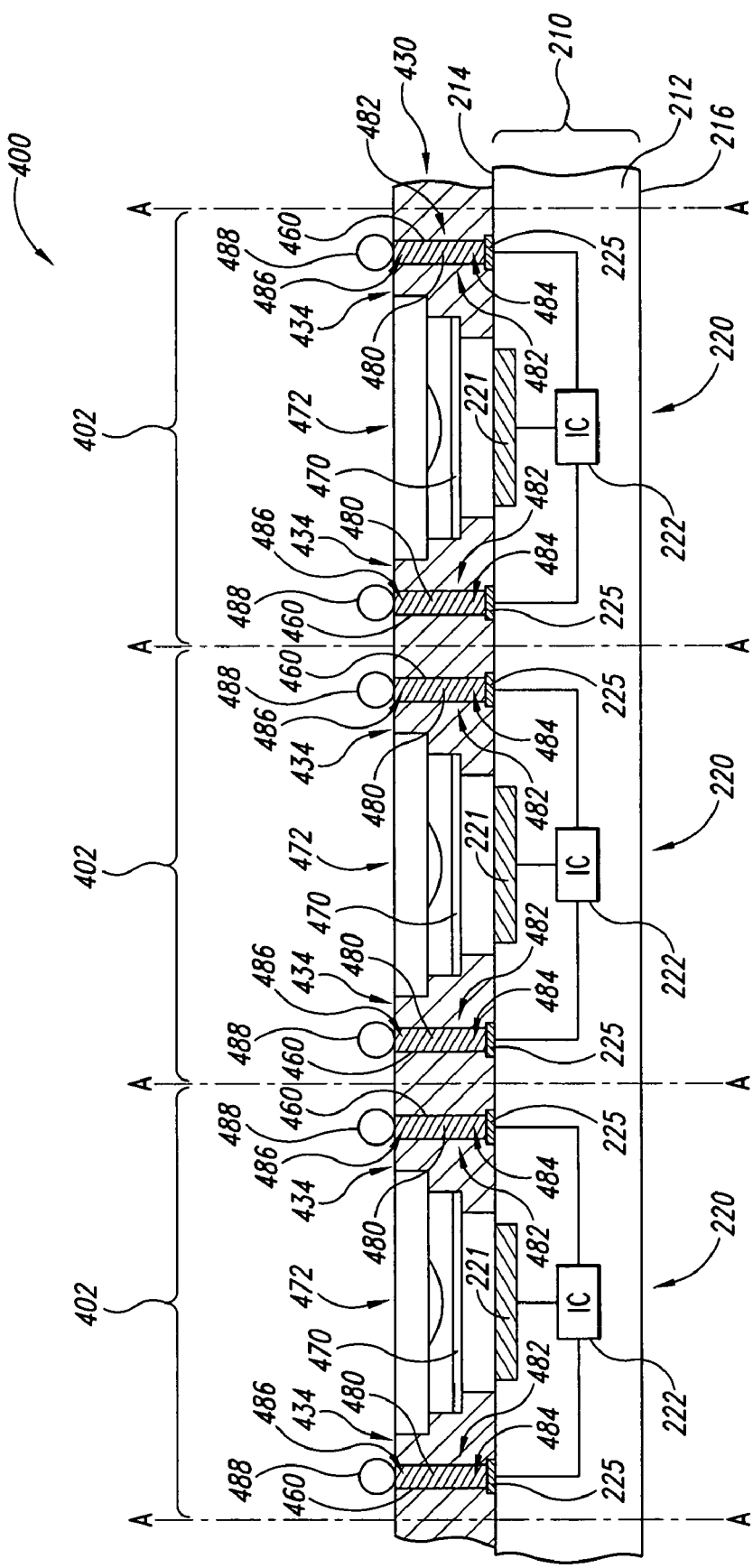

FIGS. 4A-4E illustrate various stages of another embodiment of forming a microelectronic imager assembly with front side contacts in accordance with the invention. The initial stages of this embodiment are generally similar to the steps described above with respect to FIGS. 2A and 2B, and thus FIG. 4A shows an assembly 400 with a support material layer 430 similar to the assembly 200 illustrated in FIG. 2B. The subsequent stages of this method, however, differ from that described above with reference to FIGS. 2A-2E in that the stand-offs have a different configuration and an optical device is attached to the imaging units before singulation.

Referring to FIG. 4A, a plurality of first mounting sites having first interface features 440 are etched into an upper portion of the support material layer 430. The first mounting sites are first steps that include first alignment components 442 at a desired lateral location relative to corresponding image sensors 221. Referring next to FIG. 4B, another etching process forms first stop components 444 of the first interface features 440. The first stop components 444 provide a fixed surface at a known distance from the dies 220 for accurately positioning optical devices at a desired focal distance with respect to the image sensors 221. Still another etching process forms a plurality of second mounting sites having second interface features 450. The second interface features 450 are second steps that include second alignment components 452 and second stop components 454 for accurately positioning covers at a desired location with respect to the image sensors 221.

The etching processes also form sidewalls 456 superimposed relative to a perimeter zone around corresponding image sensors 221 that define openings 458 aligned with corresponding image sensors 221. The openings 458 are generally sized so that they correspond with the size of the image sensors 221, but this is not necessary. In several instances, the openings 458 are larger than the image sensors 221 to allow more light to reach the image sensors 221.

After the stand-offs 434 have been formed as shown in FIG. 4C, a plurality of passages or vias 460 can be etched, mechanically machined, and/or laser cut into the stand-offs 434. The passages 460 can be generally similar to the passages 260 and 360 described above with respect to FIGS. 2C and 3D, respectively. After forming the passages 460, individual covers 470 are seated with the second interface features 450 over corresponding image sensors 221. The covers 470 of the embodiment shown in FIG. 4C have been singulated to separate the individual covers 470 from each other before being seated with the interface features 450. The covers 470 can be generally similar to the covers 270/370 described above.

Referring next to FIG. 4D, individual optical devices 472 are mounted to corresponding imaging dies 220. The optical devices 472 of the embodiment shown in FIG. 4D have been singulated to separate the individual optical devices 472 from each other before being mounted to the first interface features 440. The individual optical devices 472 include second substrates 473 and optics elements 474 on and/or in the second substrates 473. The second substrates 473 can be made from glass, quartz, plastics, and/or other materials with the desired optical properties for the radiation. For example, when the imaging dies 220 are used in digital cameras, the second substrates 473 are transmissive to light in the visible spectrum. The second substrates 473, however, can be transmissive to UV light, IR, and/or any other suitable spectrum according to the particular application of the imaging dies 220. In embodiments directed toward imaging radiation in the visible spectrum, the second substrates 473 can also have films that filter UV, IR, or other undesirable spectrums of radiation. The second substrates 473, for example, can be formed of a material and/or have a coating that filters IR or near IR spectrums, and the second substrates 473 can have an anti-reflective coating. The optics elements 474 are configured to manipulate the radiation for use by the image sensors 221. For example, the optics elements 474 can include focus lenses, dispersion lenses, pin-hole lenses, filters, and/or anti-reflective films.

Automatic handling equipment can place the individual optical devices 472 on corresponding stand-offs 434. More specifically, individual first interface features 440 of the stand-offs 434 can receive engagement portions of the second substrates 473 such that the optics elements 474 of individual optical devices 472 are at a desired position with respect to corresponding image sensors 221. In other embodiments, the optical devices 472 may be secured to the stand-offs 434 using other methods.

After securing the optical devices 472 to corresponding imaging dies 220, the passages 460 can be filled with a conductive material 480 to form interconnects 482. The interconnects 482 include first portions 484 electrically coupled to corresponding bond-pads 225 on the dies 220 and second portions 486 spaced apart from the first portions 484. The interconnects 482 can be formed using similar processes and/or materials as the interconnects 282 described above with respect to FIG. 2E. After forming the interconnects 482, a plurality of connectors 488 can be electrically coupled to the second portions 486 of the interconnects 482. The workpiece 210 can then be cut along lines A-A to singulate the imagers 402.

The embodiment of the assembly 400 shown in FIG. 4E is fabricated at the wafer level such that several imagers 402 are packaged before singulating the workpiece 210 to separate the individual imagers 402 from each other. One aspect of wafer-level packaging is using automated handling equipment to install the optical devices 472 such that the optics elements 474 are aligned with and spaced apart from the corresponding image sensors 221 by a desired focal distance.

The stand-offs 434 fabricated as shown in FIGS. 4A-4E have precise dimensions to accurately position the optical devices 472 with respect to corresponding image sensors 221. For example, the upper surface of the support material layer 430 is generally formed at a precise distance from the imager sensors 221 across the entire imager workpiece 210 because three-dimensional stereolithography and certain chemical-mechanical planarization processes are capable of forming highly planar surfaces at exact endpoints across a wafer. Additionally, the etching processes shown in FIGS. 4A and 4B can accurately form the interface features 440 and 450 with respect to corresponding image sensors 221 with a high degree of precision. Therefore, the first and second interface features 440 and 450 have precise dimensions that are located relative to the image sensors to position the covers 470 and optical devices 472 within very tight tolerances. This allows automated handling equipment to attach the covers 470 and/or optical devices 472 to the imaging dies 220 at the wafer level without manually adjusting the focal distance.

The embodiment of the method illustrated in FIGS. 4A-4E is also efficient in that it has a relatively high throughput and uses existing equipment and processes in a semiconductor fabrication facility. The deposition, chemical-mechanical planarization, and etching procedures are established processes that are used to manufacture semiconductor devices having feature sizes of 0.11 µm or less. As a result, the stand-offs 434 can be formed in a process flow for manufacturing semiconductor devices.

Figure 4F:
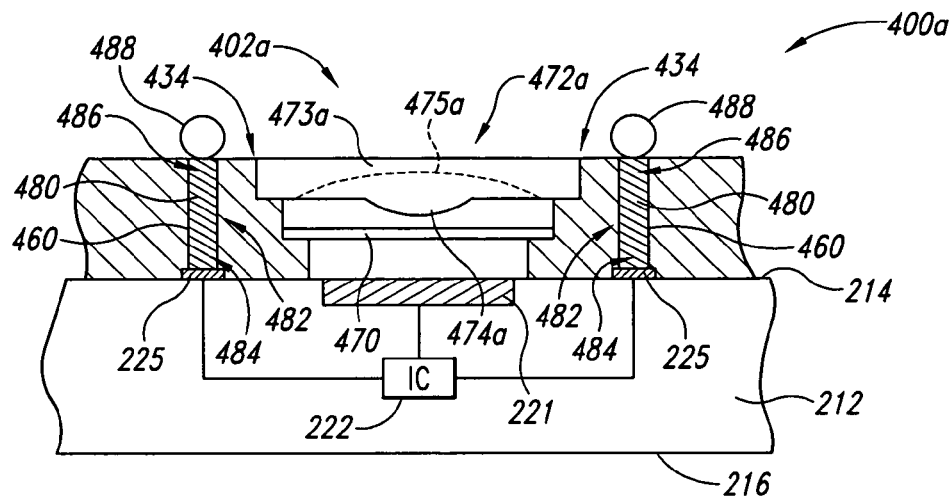
FIGS. 4F-4H are side cross-sectional views illustrating a microelectronic imager assembly in accordance with further embodiments of the invention.
Figure 4G:
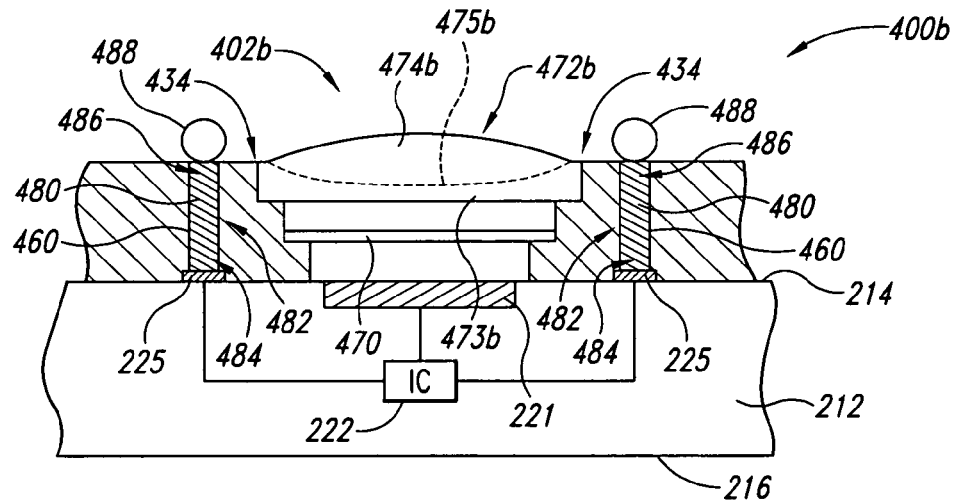
Figure 4H:
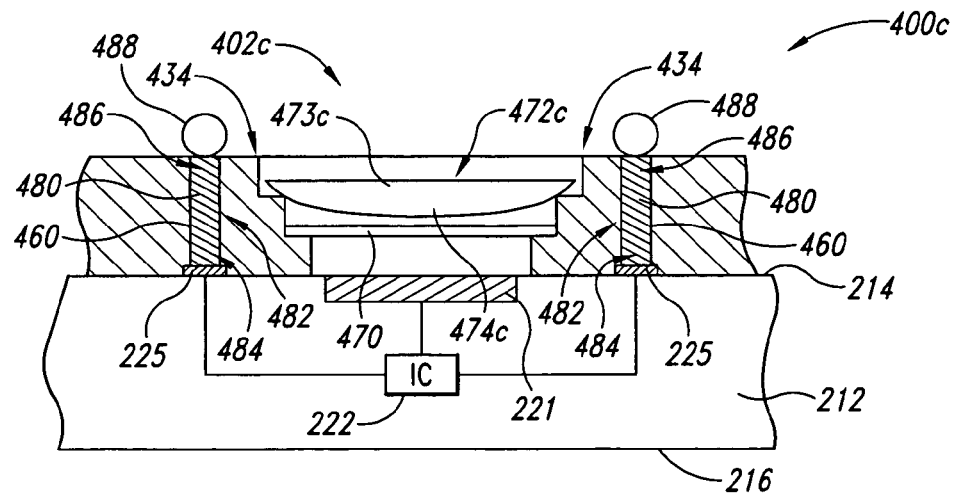

In other embodiments, the imagers can include optical devices having configurations different than those described above. FIGS. 4F-4H for example, are side cross-sectional views illustrating microelectronic imager assemblies 400a-400c, respectively, in accordance with additional embodiments of the invention. Referring to FIG. 4F, an imager 402a includes an optical device 472a having a second substrate 473a and optics element 474a on and/or in the second substrate 473. The optical device 472a differs from the optical devices 472 described previously in that the second substrate 473a and optics element 474a are integral (i.e., formed from a single piece of material). The optical element 474a shown in FIG. 4F projects toward the image sensor 221, but in other embodiments the surface may form a depression in the second substrate 473a as shown by broken line 475a.

In other embodiments, the optical devices may have curved surfaces with any combination of convex and/or concave curvatures with respect to the substrate 212 to provide the desired optics. FIG. 4G, for example, illustrates an imager assembly 400b including an imager 402b with an optical device 472b. The optical device 472b includes a second substrate 473b and an optical element 474b integral with each other. The optical device 472b differs from the optical devices described previously in that a curved surface of the optical device 472b projects away from the image sensor 221 rather than toward the image sensor. Conversely, the optical device 472b may have a curved surface 475b (shown in broken lines).

In still another embodiment shown in FIG. 4H, an imager 402c can include an optical device 472c having a second substrate 473c and an integral optical element 474c. In this embodiment, the optical device 472c includes a curved surface that contacts the first interface feature 440 (FIG. 4A), but does not mate completely with the first interface feature 440. Each of the optical devices 472a-472c can be formed from materials generally similar to the materials used to form the optical devices 472. In each of the embodiments shown in FIGS. 4F-4H, the second substrates 473a-c can be formed of selected materials and/or have selected coatings to filter unwanted radiation as described above.

Figure 5A:
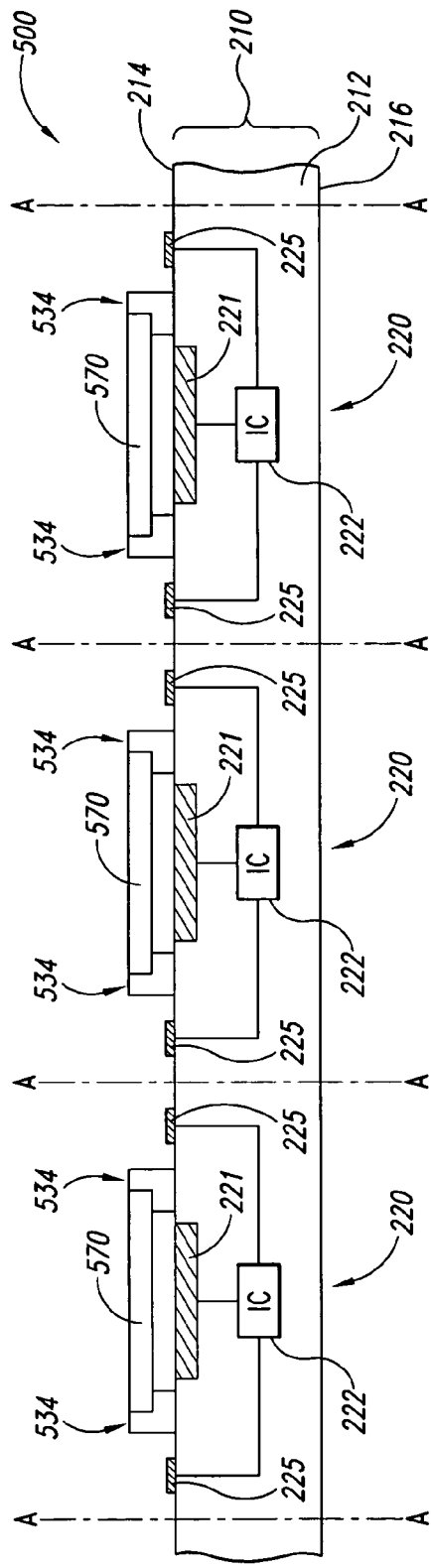
FIGS. 5A-5C are side cross-sectional views illustrating stages of a method for forming a microelectronic imager assembly with front side contacts in accordance with yet another embodiment of the invention.
Figure 5B:
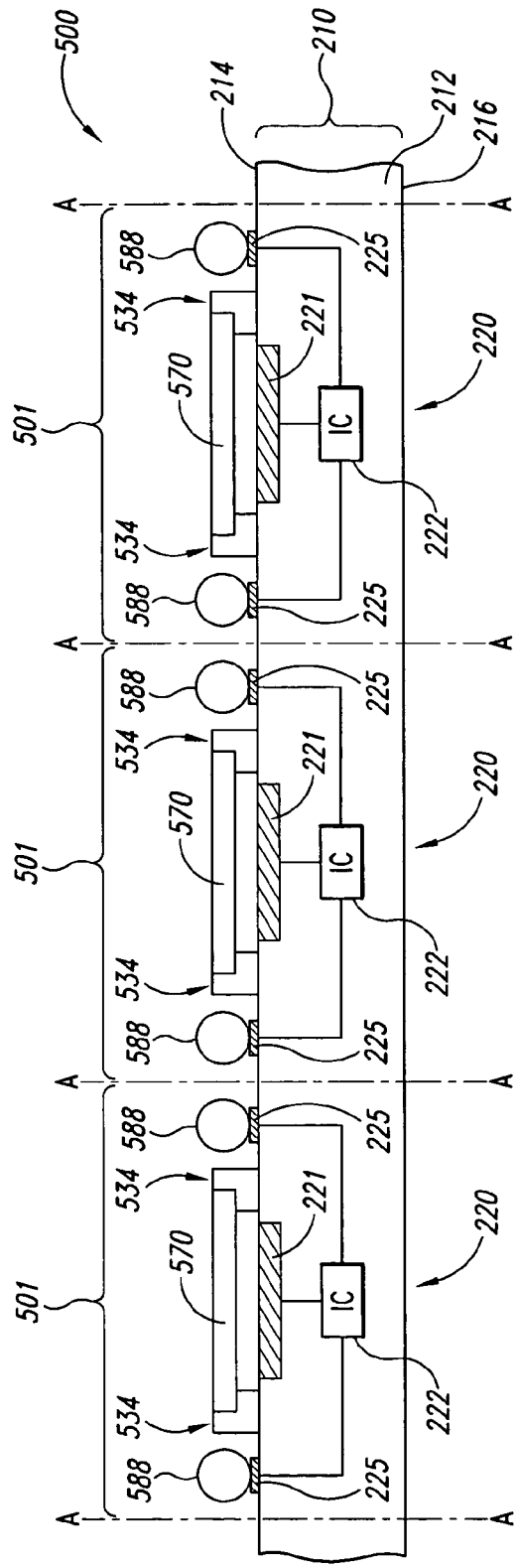
Figure 5C:
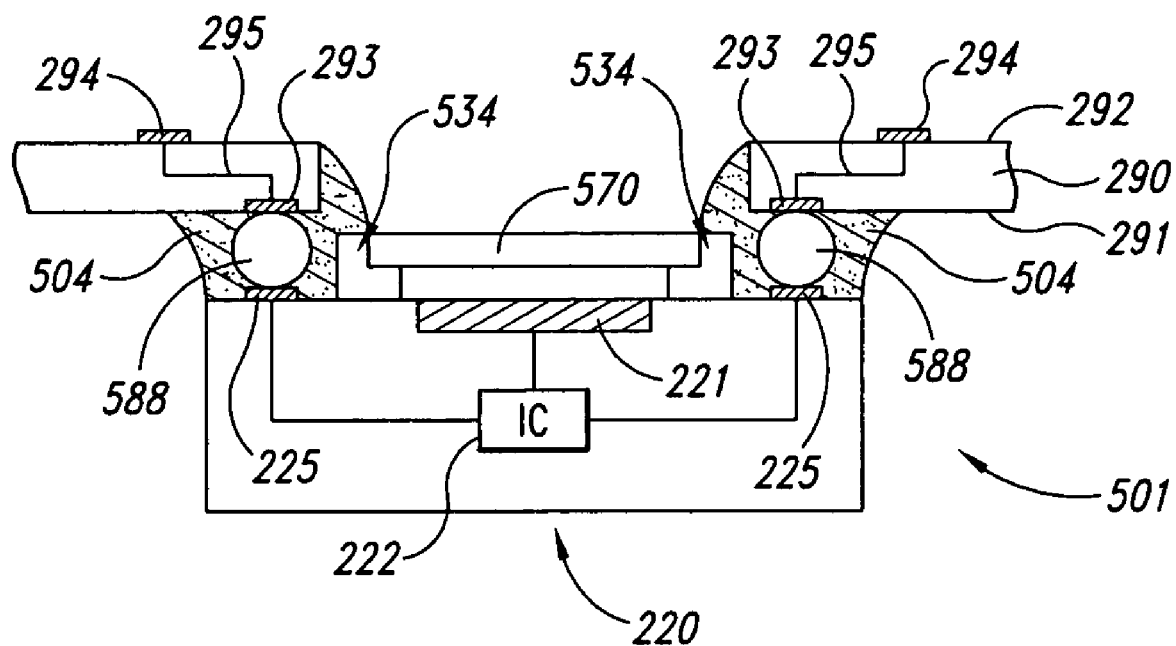

FIGS. 5A-5C illustrate various stages of yet another embodiment of a method for forming a microelectronic imager assembly 500 with front side contacts in accordance with the invention. The initial stages of this embodiment can be at least generally similar to the steps described above with reference to FIGS. 2A-2D. However, after etching the support material layer to form the stand-offs, the bond-pads 225 at the front side 214 of the substrate 212 are exposed. Referring to FIG. 5A, for example, the stand-offs 534 in the illustrated embodiment are outboard of the image sensors 221 on the imaging dies 220 and inboard of the bond-pads 225. Accordingly, passages do not need to be formed through the stand-offs 534 to construct the external contacts at the front side of the imaging dies 220. The stand-offs 534 in the illustrated embodiment can be similar to or the same as those shown and described in U.S. application Ser. No. 10/723,363, which is incorporated herein by reference. A plurality of covers 570 can be seated with the stand-offs 534 over corresponding image sensors 221 on the imaging dies 220. The covers 570 can be generally similar to the covers 270/370/470 described above. In alternative embodiments, optical devices can be mounted on the stand-offs 534 in addition to or in lieu of the covers 570.

Referring next to FIG. 5B, a plurality of conductive connectors 588 are attached to corresponding bond-pads 225 on the imaging dies 220. The connectors 588 provide external contacts to electrically couple the bond-pads 225 to other devices at the front side 214 of the imaging dies 220. The connectors 588 can be generally similar to the connectors 288 described above with respect to FIG. 2E. After attaching the connectors 588, the workpiece 210 is cut along lines A-A to singulate the individual imaging units 501.

Referring to FIG. 5C, the singulated imaging units 501 can then be attached to a support member 290, as described above with respect to FIG. 2F. The attachment process in this embodiment differs from the method shown in FIG. 2F in that an underfill material 504 can be deposited in the gaps between the imaging unit 501 and the support member 290. The underfill material 504 further secures the imaging unit 501 to the support member 290 and further seals the device for protecting the imager 502 and its components. In some embodiments, the underfill material 504 can be a highly pure material to minimize contamination and thereby reduce or eliminate the loss of images and/or light scattering. In other embodiments, the underfill material 504 can be other types of materials. After attaching the singulated imaging unit 501 to the support member 290, the imaging unit 501 can undergo further packaging steps as described above with respect to FIG. 2F.

From the foregoing, it will be appreciated that specific embodiments of the invention have been described herein for purposes of illustration, but that various modifications may be made without deviating from the spirit and scope of the invention. The features and components of any of the embodiments shown above can be interchanged with each other in additional embodiments of the invention. For example, the optical devices 472a-472c shown in FIGS. 4F-4H can be used with the imagers 201 (FIG. 2E) and imagers 402 (FIG. 4E). Accordingly, the invention is not limited except as by the appended claims.

I claim:

1. A microelectronic imager assembly, comprising:
   a workpiece comprising:
      a substrate including a front side and a backside; and
      a plurality of imaging dies formed at least partially within the substrate, the imaging dies comprising image sensors at the front side of the substrate, integrated circuitry operatively coupled to the image sensors, and bond-pads at the front side of the substrate electrically coupled to the integrated circuitry;
   a plurality of stand-offs, each stand-off comprising a front side and a back side, the back side being in contact with the front side of the substrate, the stand-offs having apertures aligned with corresponding image sensors; and
   a plurality of external contacts terminating at the front side of the stand-offs and electrically coupled at the front side of the substrate to corresponding bond-pads of the imaging dies.

2. The assembly of claim 1 wherein the plurality of external contacts comprises a plurality of interconnects extending through the stand-offs and electrically coupled to corresponding bond-pads.

3. The assembly of claim 1 wherein the plurality of external contacts comprises a plurality of connectors electrically coupled to corresponding bond-pads.

4. The assembly of claim 1 wherein:
   the plurality of external contacts comprise a plurality of interconnects extending through the stand-offs and electrically coupled to corresponding bond-pads, the interconnects including first end portions electrically coupled to the bond-pads and second end portions spaced apart from the first end portions; and
   the assembly further comprises a plurality of connectors electrically coupled to the second end portions of the interconnects.

5. The assembly of claim 1, further comprising a plurality of covers over corresponding image sensors, the individual covers being supported by the stand-offs at corresponding dies and transmissive to a desired radiation for the image sensors.

6. The assembly of claim 5 wherein the covers further comprise a curved surface to direct the radiation.

7. The assembly of claim 1 wherein:
   the stand-offs comprise steps and sidewalls defining interface features; and
   the imager assembly further comprises covers over corresponding image sensors, the individual covers being seated with the interface features at corresponding dies and transmissive to a desired radiation for the image sensors.

8. The assembly of claim 1 wherein:
   the stand-offs comprise first mounting sites having first steps and second mounting sites having second steps; and
   the imager assembly further comprises (a) covers over corresponding image sensors, the individual covers being seated with first steps at corresponding dies, and (b) optical devices including second substrates seated with second steps and optics elements on and/or in the second substrates aligned with corresponding image sensors.

9. The assembly of claim 1, further comprising a plurality of optical devices attached to the stand-offs and/or the substrate, the optical devices having optics elements positioned at a desired location relative to corresponding image sensors.

10. The assembly of claim 1, further comprising a plurality of optical devices attached to the stand-offs and/or the substrate, and wherein the optical devices include focus lenses, dispersion lenses, pin-hole lenses, filters, and/or anti-reflective films.

11. The assembly of claim 1, further comprising a plurality of trenches between individual image sensors, the individual trenches extending into the front side of the substrate an intermediate depth.

12. The assembly of claim 1 wherein the stand-offs comprise a three-dimensional stereolithography material, an epoxy, and/or a UV curable material.

13. A microelectronic imaging unit, comprising:
a microelectronic die having a front side and a backside, an image sensor formed within the front side, an integrated circuit electrically coupled to the image sensor, and a plurality of bond-pads at the front side electrically coupled to the integrated circuit;
a stand-off projecting from the die and having an opening aligned with the image sensor, the stand-off comprising a front side and a back side, the back side of the stand-off being in contact with the front side of the die; and
a plurality of external contacts terminating at the front side of the stand-off and operatively coupled at the front side of the substrate to corresponding bond-pads of the microelectronic die.

14. The imaging unit of claim 13 wherein the plurality of external contacts comprises a plurality of interconnects extending through the stand-off and electrically coupled to corresponding bond-pads.

15. The imaging unit of claim 13 wherein the plurality of external contacts comprises a plurality of connectors electrically coupled to corresponding bond-pads.

16. The imaging unit of claim 13 wherein:
the plurality of external contacts comprise a plurality of interconnects extending through the stand-off and electrically coupled to corresponding bond-pads, the interconnects including first end portions electrically coupled to the bond-pads and second end portions spaced apart from the front side of the die; and
the imaging unit further comprises a plurality of connectors electrically coupled to the second end portions of the interconnects.

17. The imaging unit of claim 13, further comprising a cover over the image sensor and engaged with the stand-off, the cover being transmissive to radiation for the image sensor.

18. The imaging unit of claim 17 wherein the cover further comprises a curved surface to direct the radiation.

19. The imaging unit of claim 13 wherein:
the stand-off comprises a step and a sidewall defining an interface feature, and
the imaging unit further comprises an optical device having a substrate and an optics element on and/or in the substrate, the optical device being seated with the interface feature to position the optics element at a desired location relative to the image sensor.

20. The imaging unit of claim 13 wherein the stand-off comprises a first mounting site having a first step and a second mounting site having a second step, and wherein the imaging unit further comprises:
a cover over the image sensor and seated with the first step, the cover being transmissive to radiation for the image sensor; and
an optical device having an optics element seated with the second step to position the optics element at a desired location relative to the image sensor.

21. The imaging unit of claim 13 wherein the stand-off comprises (a) a first mounting site having a first alignment and a first stop component, the first alignment component being at a preset lateral location from the image sensor and the first stop component being at a fixed preset elevation from the image sensor, and (b) a second mounting site having a second alignment component and a second stop component, the second alignment component being at a preset lateral location from the image sensor and the second stop component being at a fixed preset elevation from the image sensor, and wherein the imaging unit further comprises:
a cover over the image sensor and engaged with the first alignment component and the first stop component, the cover being transmissive to radiation for the image sensor; and
an optical device having an optics element engaged with the second alignment component and the second stop component to position the optics element at a desired location relative to the image sensor.

22. The imaging unit of claim 13, further comprising an optical device attached to the stand-off and/or the die, the optical device having a substrate with an optics element on and/or in the substrate positioned at a desired location relative to the image sensor.

23. The imaging unit of claim 13, further comprising an optical device attached to the stand-off and/or the die, the optical device including a focus lens, a dispersion lens, a pin-hole lens, a filter, and/or an anti-reflective film.

24. The imaging unit of claim 13 wherein:
the plurality of external contacts comprise a plurality of interconnects extending through the stand-off and electrically coupled to corresponding bond-pads; and
the imaging unit further comprises a support member including an opening through the support member and a plurality of contacts proximate the opening, and wherein the image sensor is aligned with the opening and the interconnects are electrically coupled to corresponding contacts on the support member.

25. The imaging unit of claim 13 wherein:
the plurality of external contacts comprise a plurality of connectors electrically coupled to corresponding bond-pads; and
the imaging unit further comprises a support member including an opening through the support member and a plurality of contacts proximate the opening, and wherein the image sensor is aligned with the opening and the connectors are electrically coupled to corresponding contacts on the interposer substrate.

26. The imaging unit of claim 13 wherein the stand-off comprises a three-dimensional stereolithography material, an epoxy, and/or a UV curable material.

27. A microelectronic imager assembly, comprising:
a workpiece comprising:
a substrate having a front side and a backside; and
a plurality of imaging dies formed at least partially within the substrate, the imaging dies comprising image sensors at the front side of the substrate, integrated circuitry operatively coupled to the image sensors, and bond-pads at the front side of the substrate electrically coupled to the integrated circuitry;
a plurality of stand-offs, each stand-off comprising a front side and a back side, the back side being in contact with the front side of the substrate, the stand-offs having apertures aligned with corresponding image sensors; and a plurality of interconnects terminating at the front side of the stand-offs, the interconnects extending through the stand-offs and being electrically coupled at the front side of the substrate to corresponding bond-pads of the imaging dies.

28. The assembly of claim 27 wherein:

the stand-offs includes passages extending completely through the stand-offs and aligned with corresponding bond-pads; and the interconnects comprise a conductive fill material disposed in the passages and electrically coupled to corresponding bond-pads.

29. The assembly of claim 27 wherein, further comprising a plurality of covers over corresponding image sensors, the individual covers being supported by the stand-offs at corresponding dies and transmissive to a desired radiation for the image sensors.

30. The assembly of claim 27 wherein:

the plurality of interconnects include first end portions electrically coupled to the bond-pads and second end portions spaced apart from the front side of the die; and the assembly further comprises a plurality of connectors electrically coupled to the second end portions of the interconnects.

31. The assembly of claim 27 wherein the stand-offs comprise first mounting sites having first steps and second mounting sites having second steps, and wherein the assembly further comprises:

a plurality of covers over the image sensors and seated with the first steps, the covers being transmissive to radiation for the corresponding image sensors; and optical devices having optics elements seated with the second steps to position the optics elements at a desired location relative to corresponding image sensors.

32. The assembly of claim 27 wherein the individual stand-offs comprise (a) a first mounting site having a first alignment and a first stop component, the first alignment component being at a preset lateral location from one of the image sensors and the first stop component being at a fixed preset elevation from the one image sensor, and (b) a second mounting site having a second alignment component and a second stop component, the second alignment component being at a preset lateral location from the one image sensor and the second stop component being at a fixed preset elevation from the one image sensor, and wherein the assembly further comprises:

a plurality of covers over the image sensors and engaged with the first alignment components and the first stop components, the covers being transmissive to -radiation for the corresponding image sensors; and optical devices having optics element engaged with the second alignment components and second stop components to position the optics elements at a desired location relative to corresponding image sensors.

33. The assembly of claim 27, further comprising optical devices attached to the stand-offs and/or the substrate, the optical devices including focus lenses, dispersion lenses, pin-hole lenses, filters, and/or anti-reflective films.

34. The assembly of claim 27, further comprising a plurality of trenches between individual image sensors, the trenches extending into the front side of the substrate an intermediate depth.

35. The assembly of claim 27 wherein the stand-offs comprise a three-dimensional stereolithography material, an epoxy, and/or a UV curable material.

36. A microelectronic imager assembly, comprising:
a workpiece comprising:
a substrate including a front side and a backside; and
a plurality of imaging dies formed at least partially within the substrate, the imaging dies comprising image sensors at the front side of the substrate, integrated circuitry operatively coupled to the image sensors, and bond-pads at the front side of the substrate electrically coupled to the integrated circuitry;

a plurality of stand-offs, each stand-off comprising a front side and a back side, the back side being in contact with the front side of the substrate, the stand-offs having apertures aligned with corresponding image sensors; and a plurality of interconnects terminating at the front side of the stand-offs, the interconnects extending through the stand-offs and being electrically coupled at the front side of the substrate to corresponding bond-pads of the imaging dies;

a plurality of covers over corresponding image sensors, the individual covers being supported by the stand-offs at corresponding dies and transmissive to a desired radiation for the image sensors; and optical devices attached to the stand-offs and/or the covers, the individual optical devices including a substrate with an optics element on and/or in the substrate at a desired location relative to one of the image sensors, wherein the optical devices include focus lenses, dispersion lenses, pin-hole lenses, filters, and/or anti-reflective films.

37. The assembly of claim 36 wherein:

the stand-offs includes passages extending completely through the stand-offs and aligned with corresponding bond-pads; and the interconnects comprise a conductive fill material in the passages and electrically coupled to corresponding bond-pads.

38. The assembly of claim 36 wherein:

the plurality of interconnects include first end portions electrically coupled to the bond-pads and second end portions spaced apart from the front side of the substrate; and the assembly further comprises a plurality of connectors electrically coupled to the second end portions of the interconnects.

39. The assembly of claim 36 wherein:

the stand-offs comprise first mounting sites having first steps and second mounting sites having second steps;

the covers are seated with the first steps; and the optical devices are seated with the second steps to position the optics elements at a desired location relative to the image sensor.

40. The assembly of claim 36 wherein:

the individual stand-offs comprise (a) a first mounting site having a first alignment and a first stop component, the first alignment component being at a preset lateral location from the image sensor and the first stop component being at a fixed preset elevation from the image sensor, and (b) a second mounting site having a second alignment component and a second stop component, the second alignment component being at a preset lateral location from the image sensor and the second stop component being at a fixed preset elevation from the image sensor;

the covers are engaged with first alignment components and the first stop components; and the optical devices are engaged with the second alignment components and the second stop components to position the optics elements at a desired location relative to the corresponding image sensors.

41. The assembly of claim 36 wherein the stand-offs comprises a three-dimensional stereolithography material, an epoxy, and/or a UV curable material.

42. The assembly of claim 36 wherein the covers include glass, quartz, and/or other materials transmissive to a desired spectrum of radiation.

43. A microelectronic imager assembly, comprising:
a workpiece comprising:
    a substrate including a front side and a backside; and
    a plurality of imaging dies formed at least partially within the substrate, the imaging dies comprising image sensors at the front side of the substrate, integrated circuitry operatively coupled to the image sensors, and bond-pads at the front side of the substrate electrically coupled to the integrated circuitry;
a plurality of spacers projecting from the front side of the substrate, each spacer comprising a front side and a back side, the back side of the spacer being in contact with the front side of the substrate, and openings aligned with the image sensors;
a plurality of covers over corresponding image sensors, the individual covers being supported by the spacers at a corresponding die and transmissive to a desired radiation for the image sensors; and
a plurality of connectors terminating at the front side of the spacers and electrically coupled at the front side of the substrate to corresponding bond-pads of the imaging dies.

44. The assembly of claim 43 wherein the spacers comprise a three-dimensional stereolithography material, an epoxy, and/or a UV curable material.

45. The assembly of claim 43 wherein the covers includes glass, quartz, and/or other materials transmissive to a desired spectrum of radiation.

46. The assembly of claim 43 wherein:
the spacers comprise steps and sidewalls defining interface features; and
the covers are seated with the interface features at a corresponding die.

47. The assembly of claim 43, further comprising a plurality of optical devices attached to the spacers and/or the substrate, the optical devices having optics elements positioned at a desired location relative to corresponding image sensors.

48. The assembly of claim 43, further comprising a plurality of optical devices attached to the spacers and/or the substrate, and wherein the optical devices include focus lenses, dispersion lenses, pin-hole lenses, filters, and/or anti-reflective films.

49. A microelectronic imager, comprising:
a microelectronic die having a front side and a backside, an image sensor formed within the front side, an integrated circuit electrically coupled to the image sensor, and a plurality of bond-pads at the front side electrically coupled to the integrated circuit;
a stand-off projecting from the die and having an opening aligned with the image sensor, the stand-off comprising a front side and a back side, the back side of the stand-off being in contact with the front side of the die, and a three-dimensional stereolithography material, an epoxy, and/or a UV curable material;
a plurality of interconnects extending through the stand-off and electrically coupled at the front side of the die to corresponding bond-pads of the microelectronic die, the interconnects including first end portions electrically coupled to the bond-pads and second end portions at the front side of the stand-off, spaced apart from the first end portions;
a plurality of connectors electrically coupled to the second end portions of the interconnects so as to each abut the front side of the stand-off;
a cover over the image sensor and attached to the stand-off, wherein the cover is transmissive to a desired radiation for the image sensor; and
an optical device attached to the stand-off and/or the cover, the individual optical device including a substrate with an optics element on and/or in the substrate at a desired location relative to the image sensor, the optical devices including a focus lens, a dispersion lens, a pin-hole lens, a filter, and/or an anti-reflective film.

50. The imager of claim 49 wherein:
the stand-off includes passages extending completely through the stand-off and aligned with corresponding bond-pads; and
the interconnect comprise a conductive fill material disposed in the passage and electrically coupled to corresponding bond-pads.

51. The imager of claim 49 wherein:
the stand-off comprises a first mounting site having a first step and a second mounting site having a second step;
the cover is seated with the first step; and
the optical device is seated with the second step to position the optics element at a desired location relative to the image sensor.

* * * * *

UNITED STATES PATENT AND TRADEMARK OFFICE
CERTIFICATE OF CORRECTION

PATENT NO.        : 7,646,075 B2
APPLICATION NO. : 11/177905
DATED             : January 12, 2010
INVENTOR(S)       : Salman Akram It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 782 days.

Signed and Sealed this

Sixteenth Day of November, 2010

David J. Kappos
*Director of the United States Patent and Trademark Office*